(12) United States Patent
Oishi et al.

(10) Patent No.: US 8,671,372 B2
(45) Date of Patent: Mar. 11, 2014

(54) VERIFICATION SUPPORT COMPUTER PRODUCT, APPARATUS, AND METHOD

(75) Inventors: Ryosuke Oishi, Kawasaki (JP); David Thach, Kawasaki (JP); Yutaka Tamiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 803 days.

(21) Appl. No.: 12/838,845

(22) Filed: Jul. 19, 2010

(65) Prior Publication Data

US 2011/0270787 A1 Nov. 3, 2011

(30) Foreign Application Priority Data

Apr. 30, 2010 (JP) ................................. 2010-105899

(51) Int. Cl.
*G06F 17/50* (2006.01)
*G06F 17/10* (2006.01)

(52) U.S. Cl.
USPC ........... 716/106; 716/100; 716/111; 716/136; 716/139; 703/2; 703/14; 703/15

(58) Field of Classification Search
USPC ........ 716/100, 106, 111, 136, 139; 703/2, 14, 703/15
See application file for complete search history.

(56) References Cited

U.S. PATENT DOCUMENTS

| 7,363,202 | B2 * | 4/2008 | Campbell et al. .................. 703/2 |
| 7,716,610 | B2 * | 5/2010 | Challenger et al. ............ 716/100 |
| 8,255,852 | B2 * | 8/2012 | Challenger et al. ............ 716/116 |
| 8,320,770 | B2 * | 11/2012 | Nedovic ......................... 398/155 |
| 2007/0028203 | A1 * | 2/2007 | Sato et al. ........................ 716/18 |
| 2010/0251208 | A1 * | 9/2010 | Murthy .......................... 717/104 |
| 2010/0251209 | A1 * | 9/2010 | Murthy .......................... 717/104 |
| 2011/0238400 | A1 * | 9/2011 | Thimmapuram ................ 703/15 |
| 2012/0017200 | A1 * | 1/2012 | Ghosh et al. ................... 717/126 |

FOREIGN PATENT DOCUMENTS

| JP | 5-6272 | 1/1993 |
| JP | 9-293093 | 11/1997 |
| JP | 2001-331544 | 11/2001 |
| JP | 2006-112852 | 4/2006 |

OTHER PUBLICATIONS

Seol et al.; "Interoperability test generation and minimization for communication protocols based on the multiple stimuli principle"; Publication Year: 2004; Selected Areas in Communications, IEEE Journal on; vol. 22 , Issue: 10; pp. 2062-2020.*
Nguyen et al.; "Transition-by-transition FSM traversal for reachability analysis in bounded model checking"; Publication Year: 2005; Computer-Aided Design, 2005. ICCAD-2005. IEEE/ACM International Conference on; pp. 1068-1075.*
Liu et al.; "An efficient functional coverage test for HDL descriptions at RTL"; Publication Year: 1999; Computer Design, 1999. (ICCD '99) International Conference on; pp. 325-327.*

* cited by examiner

*Primary Examiner* — Helen Rossoshek
(74) *Attorney, Agent, or Firm* — Staas & Halsey LLP

(57) ABSTRACT

A verification support program that causes a computer to execute identifying from a finite state machine model related to a circuit-under-test, an input count of transitions to a transition-end state and an output count of transitions from the transition-end state; determining the transition-end state to be a record/restore subject, if the identified output transition is greater than the identified input transition count; embedding record-instruction information causing the record/restore subject to be recorded to a database, if a first element causing transition to the record/restore subject is included in a first test scenario that is in a test scenario group related to the circuit-under-test; and embedding restore-instruction information causing the record-restore subject to be restored from the database, if a second element causing transition to the record-restore subject is included in a series of elements making up a second test scenario that is in the test scenario group.

3 Claims, 20 Drawing Sheets

VERIFICATION SUPPORT COMPUTER PRODUCT, APPARATUS, AND METHOD

CROSS REFERENCE TO RELATED APPLICATIONS

This application is based upon and claims the benefit of priority of the prior Japanese Patent Application No. 2010-105899, filed on Apr. 30, 2010, the entire contents of which are incorporated herein by reference.

FIELD

The embodiments discussed herein are related to verification support for circuit verification.

BACKGROUND

Conventionally, technology shortens the time consumed for circuit simulation and generates test scenarios based on state transition tables.

Nonetheless, with the conventional technologies above, for a finite state machine (FSM) model of a circuit-under-test, states that should be saved, restored, etc. cannot be identified and thus, design engineers must manually designate the states, resulting in a large burden on the engineers. Further, since such designation is dependent on the ability of the design engineer, differences in designation arise among the engineers and in some cases, the simulation time cannot be reduced adequately.

Typically, even for the same circuit-under-test, since the test scenarios and the FSM model are created by the design engineer, it takes time before the simulation is conducted and the burden on the design engineer becomes great.

Further, if discrepancies arise between the created test scenarios and the FSM model, simulation must be repeated, resulting in an increase in the simulation time. A problem further arises in that if paths that are substantially the same in the FSM model are stored as different paths, each of the paths must be simulated, increasing the simulation time.

SUMMARY

According to an aspect of an embodiment, a non-transitory, computer-readable recording medium stores therein a verification support program causing a computer to execute identifying from a finite state machine model related to a circuit-under-test, an input transition count of transitions to a transition-end state and an output transition count of transition from the transition-end state; determining the transition-end state to be a record/restore subject, if the identified output transition count is greater than the identified input transition count; embedding record-instruction information causing the record/restore subject determined at the determining to be recorded to a database, if a first element causing transition to the record/restore subject is included in a series of elements making up a first test scenario that is in a test scenario group related to the circuit-under-test, the record-instruction information being embedded as a subsequent element of the first element in the first test scenario; and embedding restore-instruction information causing the record-restore subject to be restored from the database, if a second element causing transition to the record-restore subject is included in a series of elements making up a second test scenario that is in the test scenario group, the restore-instruction information being embedded in the second test scenario and replacing a head element to the second element of the series of elements making up the second test scenario.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of a verification support program, a verification support apparatus, and a verification support method according to the present invention will be explained with reference to the accompanying drawings.

Test scenario reductions in the first embodiment will be explained using FIGS. 1 to 3.

Figure 1:
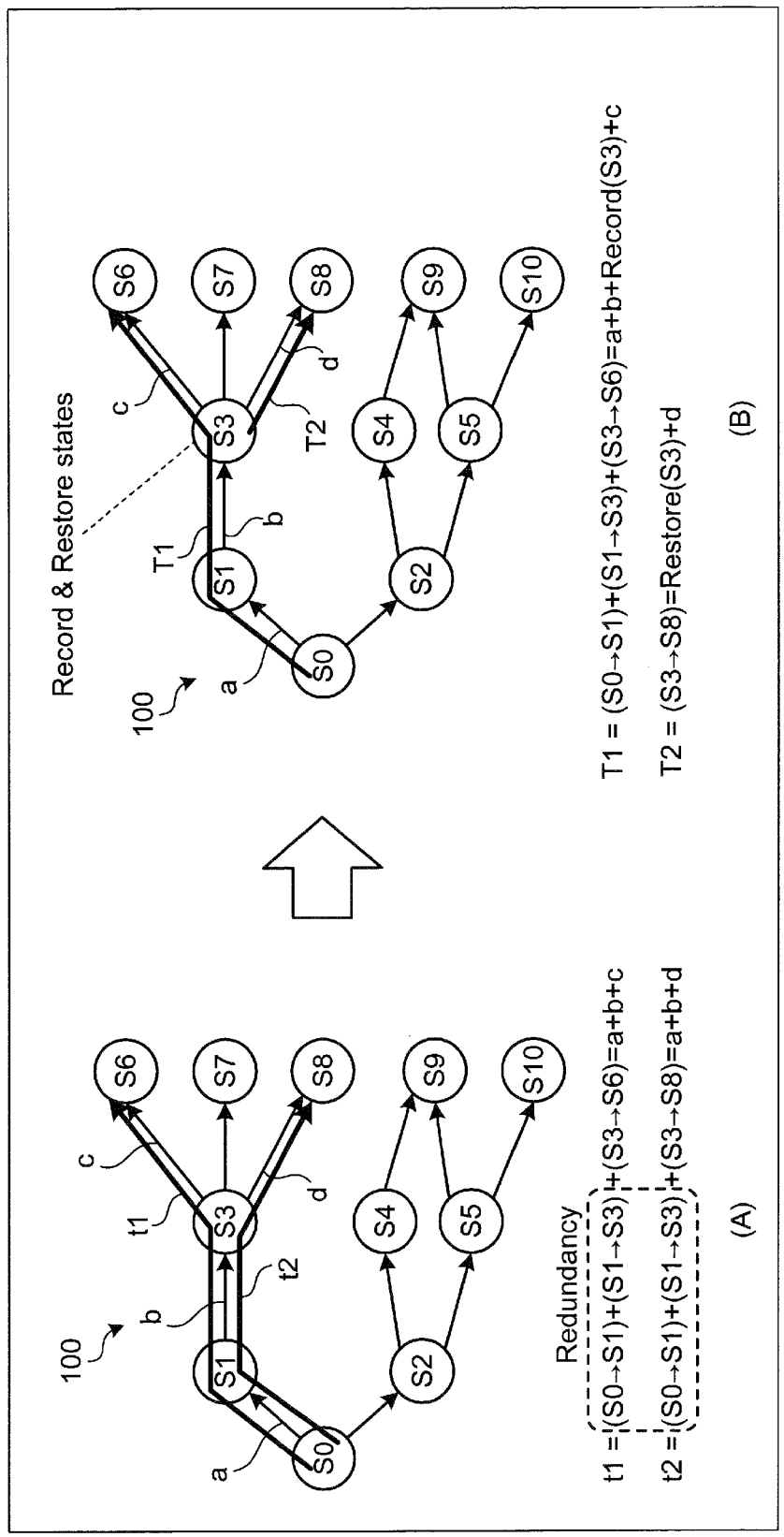
FIG. 1 is a schematic of one example of test scenario reduction.

FIG. 1 is a schematic of one example of test scenario reduction. In FIG. 1, (A) depicts an FSM model 100 for a circuit-under-test and test scenarios t1, t2 before reduction; (B) depicts the FSM model 100 and test scenarios T1, T2 after reduction. In the FSM model 100, s# (# is a numeral) represent states and arrows represent transitions.

Further, a state at the end of the tail of an arrow representing a transition is referred to as a "transition-start state"; a state at the head of an arrow (transition) is referred to as a "transition-end state". S0 represents the initial state. The FSM model 100 used in the present embodiment is merely one example and FSM models are determined according to each circuit-under-test.

In circuit simulation, for example, transitions are an input pattern provided to a combinational circuit of a circuit-under-test and a state is the value retained in the register that receives output from the combinational circuit. Thus, a transition-end state is the output value retained in the register and output from the combinational circuit when a given input pattern, as transitions, is provided to the combinational circuit. A transition-start state is the value in a register prior to transition. Here, since the simulation has not been executed, the register value indicating the state is represented by a variable, not an actual value 0/1.

In the FSM model 100, the test scenario t1 is a transition path passing through S0→S1→S3→S6, where t1={a, b, c}. Further, in the FSM, the test scenario t2 is a transition path passing through S0→S1→S3→S8, where t2={a, b, d}. Here, element a is a transition representing (S0→S1); element b is a transition representing (S1→S3); element c is a transition representing (S3→S6); and element d is a transition representing (S3→S8).

As depicted in (A), in the test scenarios t1, t2, transitions {a, b} passing through S0→S1→S3 are redundant (Redundancy). Therefore, in the present embodiment, the test scenario t1 is converted to the test scenario T1 embedded with "record(S3)". Further, the test scenario t2 is converted to the test scenario T2 embedded with "restore(S3)". Consequently, simulation from the state S0 to the state S3 is executed in the test scenario T1 alone and in other test scenarios such as the test scenario T2, simulation from the state S0 to the state S3 is not necessary and instead, the state S3 is restored, facilitating a reduction of the test scenario t2. "record(S3)" indicates a record instruction for state S3 and "restore(S3)" indicates a restore instruction for state S3.

Figure 2:
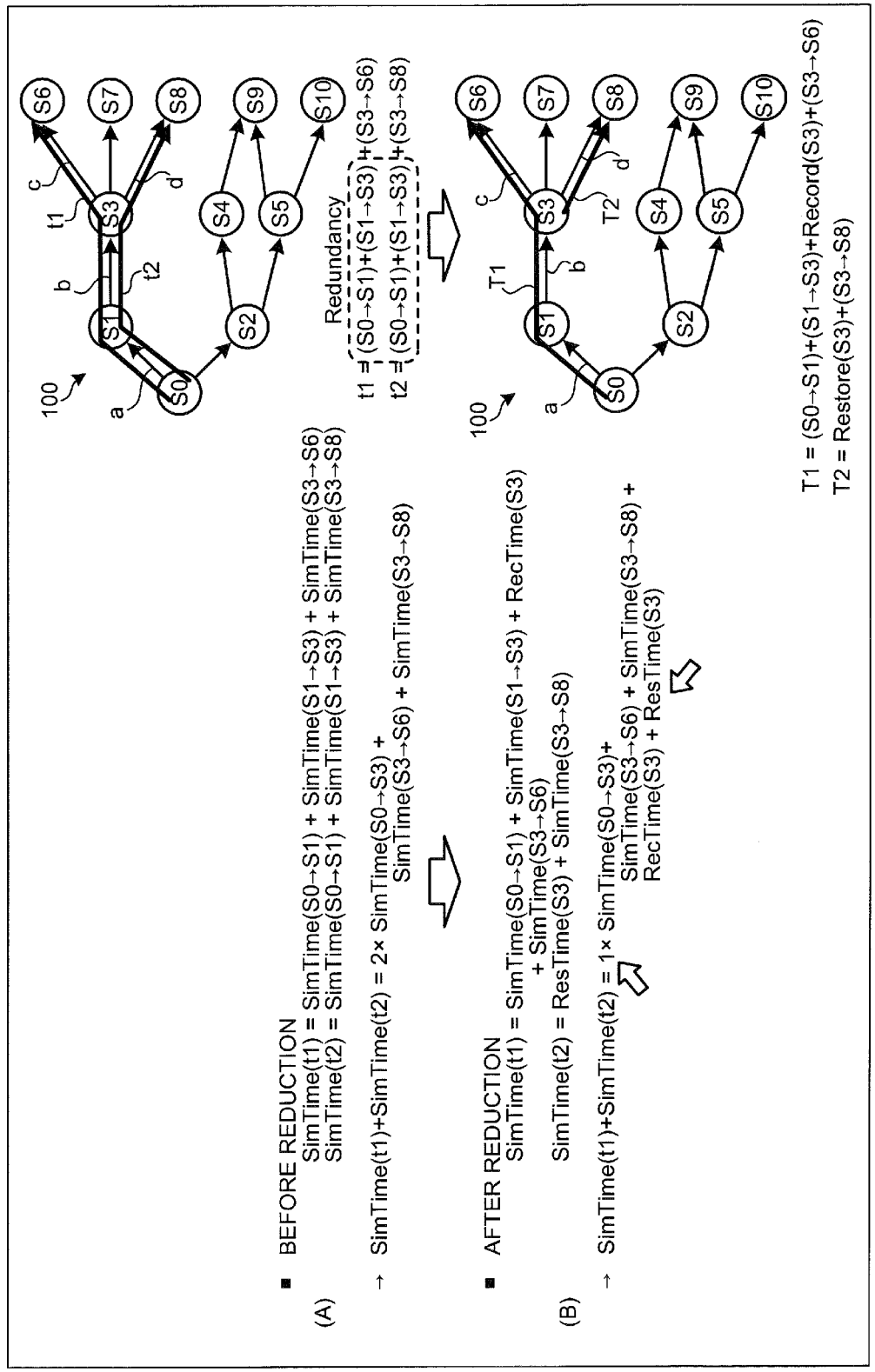
FIG. 2 is a schematic depicting a comparison example of simulation times for test scenarios after the reduction depicted in FIG. 1.

FIG. 2 is a schematic depicting a comparison example of simulation times of the test scenarios after the reduction depicted in FIG. 1. In FIG. 2, SimTime( ) is the simulation time when simulation is executed for the test scenario or transition path indicated in the parenthesis ( ). For example, SimTime(t1) is the simulation time when the circuit-under-test is simulated using test scenario t1.

(A) depicts the simulation time before the reduction depicted in (A) of FIG. 1. The sum of the simulation time SimTime(t1) for the test scenario t1 and the simulation time SimTime(t2) for the test scenario t2 includes the simulation time SimTime(S0→S3) for a redundant transition path from the state S0 to the state S3 and thus, takes twice as long.

(B) depicts the simulation time after the reduction depicted in (B) of FIG. 1(B). In (B), since the test scenario t2 is reduced to T2, the SimTime(S0→S3) is not redundant and is reduced to the time for 1 simulation thereof and in exchange, the record time RecTime(S3) for the state S3 in the test scenario t1 and the restore time ResTime(S3) for the state S3 in the test scenario T2 is added. Therefore, in this case, if expression (1) is satisfied, the simulation time is reduced.

$$\text{SimTime}(S0 \to S3) > \text{RecTime}(S3) + \text{ResTime}(S3) \quad (1)$$

Figure 3:
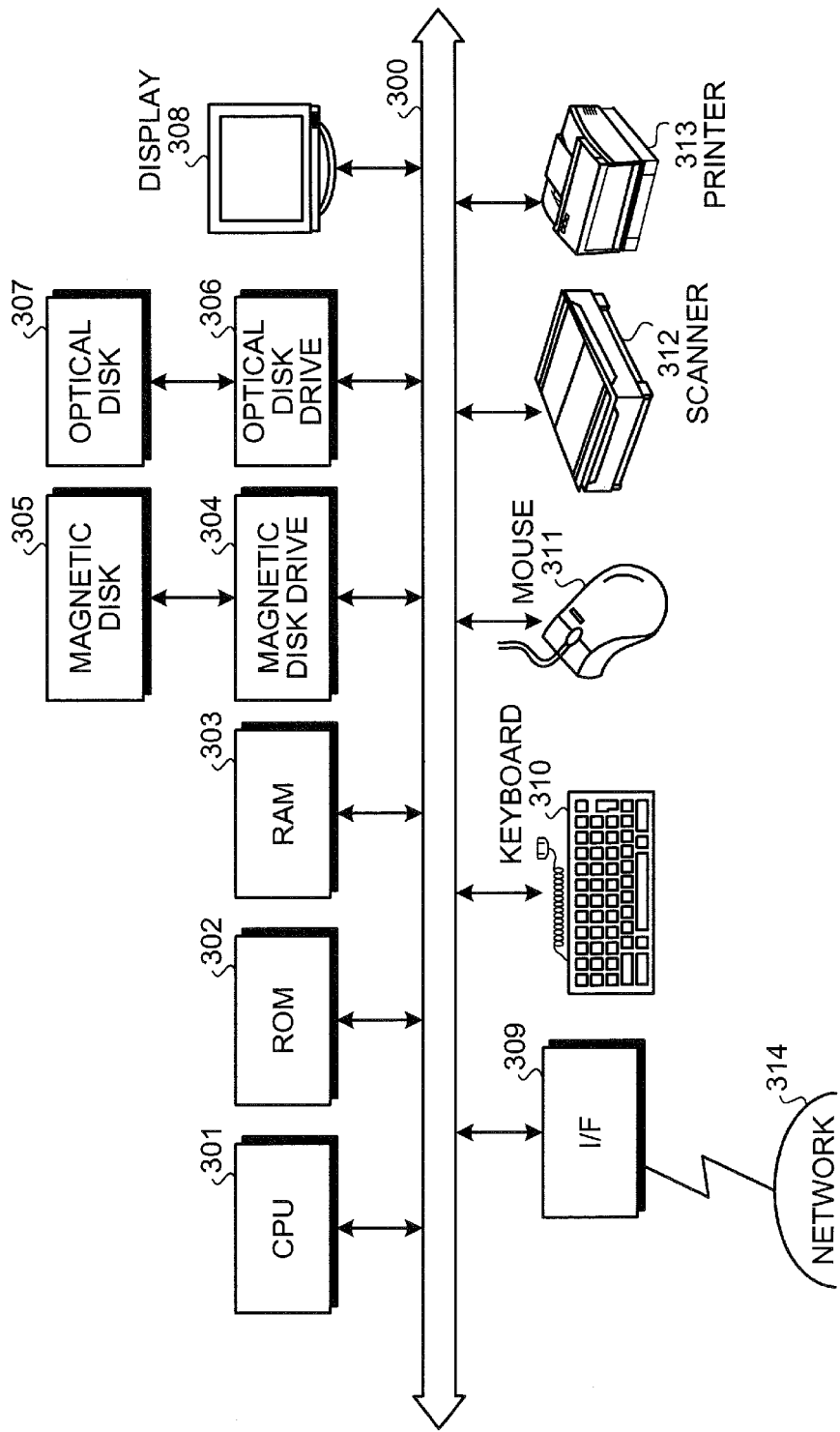
FIG. 3 is a block diagram of a hardware configuration of a verification support apparatus.

FIG. 3 is a block diagram of a hardware configuration of the verification support apparatus. As depicted in FIG. 3, the verification support apparatus includes a central processing unit (CPU) 301, a read-only memory (ROM) 302, a random access memory (RAM) 303, a magnetic disk drive 304, a magnetic disk 305, an optical disk drive 306, an optical disk 307, a display 308, an interface (I/F) 309, a keyboard 310, a mouse 311, a scanner 312, and a printer 313, respectively connected by a bus 300.

The CPU 301 governs overall control of the verification support apparatus. The ROM 302 stores therein various programs such as a boot program. The RAM 303 is used as a work area of the CPU 301. The magnetic disk drive 304, under the control of the CPU 301, controls the reading and writing of data with respect to the magnetic disk 305. The magnetic disk 305 stores data written thereto under the control of the magnetic disk drive 304.

The optical disk drive 306, under the control of the CPU 301, controls the reading and writing of data with respect to the optical disk 307. The optical disk 307 stores data written thereto under the control of the optical disk drive 306, the data stored to the optical disk 307 being readout by a computer.

The display 308 displays data such as text, images, functional information, etc., in addition to a cursor, icons, or tool boxes. The display 308 may be a cathode ray tube (CRT), a thin-film-transistor (TFT) liquid crystal display, a plasma display, etc.

The I/F 309 is connected to a network 314 such as a local area network (LAN), a wide area network (WAN), and the Internet through a communication line and is connected to other apparatuses through this network 314. The I/F 309 administers an internal interface with the network 314 and controls the input/output of data from/to external apparatuses. For example, a modem or a LAN adaptor may be employed as the I/F 309.

The keyboard 310 includes, for example, keys for inputting letters, numerals, and various instructions and performs the input of data. A touch-panel-type input pad or numeric keypad, etc. may be adopted. The mouse 311 is used to move the cursor, select a region, or move and change the size of windows. A track ball or a joy stick may be adopted provided each respectively has a function similar to a pointing device.

The scanner 312 optically reads an image into the verification support apparatus as image data. The scanner 312 may have an optical character reader (OCR) function. The printer 313 prints image data and text data. The printer 313 may be, for example, a laser printer or an ink jet printer.

Figure 4:
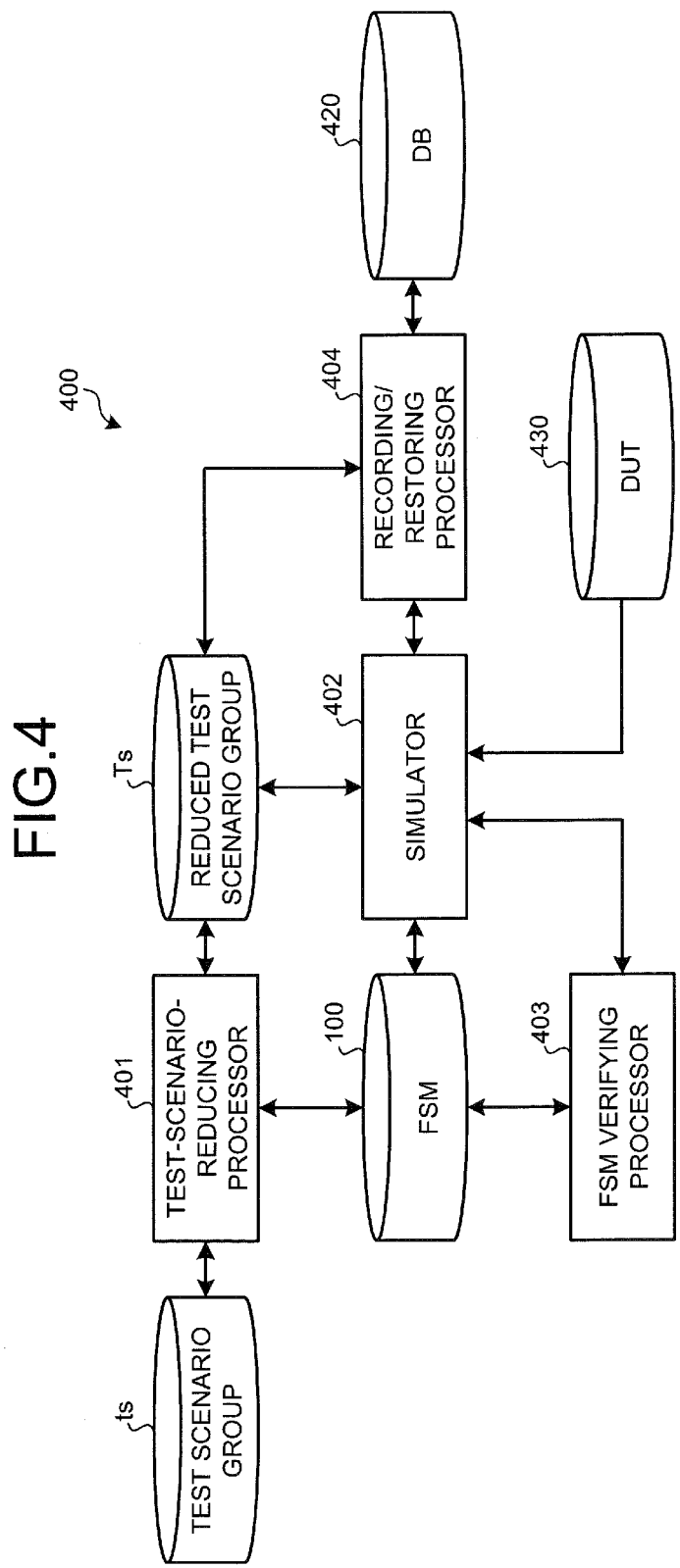
FIG. 4 is a block diagram of one example of a functional configuration of the verification support apparatus.

FIG. 4 is a block diagram of one example of a functional configuration of the verification support apparatus. A verification support apparatus 400 includes a test-scenario-reducing processor 401, a simulator 402, an FSM verifying processor 403, and a recording/restoring processor 404. Functions of the test-scenario-reducing processor 401 to the recording/restoring processor 404, specifically, for example, are implemented by the execution of a program stored in a storage apparatus such as the ROM 302, the RAM 303, the magnetic disk 305, and the optical disk 307 depicted in FIG. 3, the program being executed by the CPU 301.

More specifically, data read out from the storage apparatus, such as the ROM 302, the RAM 303, the magnetic disk 305, the optical disk 307, by the test-scenario-reducing processor 401 to the recording/restoring processor 404 is written to the RAM 303, the magnetic disk 305, or the cache of the CPU 301, a register, etc. Further, intermediate or final results of execution by the CPU 301 are written to a storage apparatus, such as the ROM 302, the RAM 303, the magnetic disk 305, the optical disk 307, etc., the cache of the CPU 301 or a register, by the test-scenario-reducing processor 401 to the recording/restoring processor 404.

The test-scenario-reducing processor 401 deletes transition paths that are redundant among test scenarios making up a test scenario group is and outputs the reduced test scenario group as test scenario group Ts. Details concerning the test-scenario-reducing processor 401 are described hereinafter using FIGS. 5 to 7.

The simulator 402 simulates the circuit-under-test. Specifically, for example, the simulator 402 reads-in hardware description information (DUT) 430 for the circuit-under-test and sequentially provides to the circuit-under-test, the test scenarios making up the reduced test scenario group Ts, to simulate the circuit-under-test for each test scenario.

The FSM verifying processor 403 verifies the FSM model 100 during the simulation by the simulator 402. Details concerning the FSM verifying processor 403 will be described hereinafter using FIGS. 8 and 9.

The recording/restoring processor 404, during the simulation by the simulator 402, records in a database 420, states to be recorded/restored and restores states readout from the database 420. Details concerning the recording/restoring processor 404 will be described hereinafter using FIGS. 10 to 13.

Figure 5:
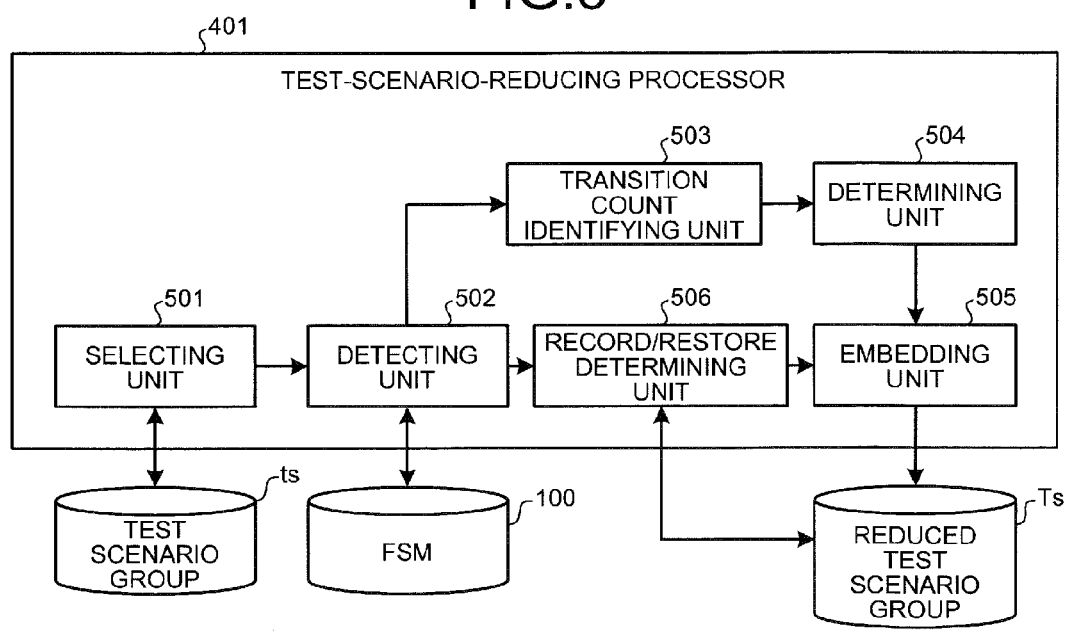
FIG. 5 is a block diagram of a functional configuration of a test-scenario-reducing processor.

FIG. 5 is a block diagram of a functional configuration of the test-scenario-reducing processor 401. The test-scenario-reducing processor 401 includes a selecting unit 501, a detecting unit 502, a transition count identifying unit 503, a determining unit 504, an embedding unit 505, and a record/restore determining unit 506.

The selecting unit 501 selects one scenario from a test scenario group related to the circuit-under-test. Specifically, for example, the selecting unit 501 sequentially selects one scenario from n test scenarios t1, t2, ..., tn making up the test scenario group ts. The test scenario group ts is stored in a storage apparatus such as the ROM 302 and the magnetic disk 305 depicted in FIG. 3.

Further, the selecting unit 501 sequentially selects elements (stimuli) from a series of elements (stimulus) making up the selected test scenario. A test scenario is a set of time series elements provided to a circuit-under-test. For example, in the test scenario t1={a, b, c} depicted in FIG. 1, a to c are elements (e.g., input pattern). Accordingly, in the test scenario t1, "a" represents (S0→S1), "b" represents (S1→S3), and "c" represents (S3→S6). The selecting unit 501 selects the elements in the sequence of a→b→c.

The detecting unit 502 detects from the FSM model 100 related to the circuit-under-test, the transition-end state of an element selected from the series of elements making up the test scenario selected by the selecting unit 501. For example, for the test scenario t1 above, if the element a is the selected element, since the element a is the state transition (S0→S1), when the element a is provided to the circuit-under-test, the state of the circuit-under-test transitions from the state S0 to the state S1. Accordingly, the detecting unit 502 detects the transition-end state S1 of the element a, i.e., if the selected element is the state transition (Sj→Sk), the detecting unit 502 detects the state Sk as the transition-end state, where the state Sj is the transition-start state.

The transition count identifying unit 503 identifies from the FSM model 100, an input transition count to and an output transition count from a transition-end state detected by the detecting unit 502. Here, an input transition count is the number of state transitions designating the detected transition-end state, as a transition-end state. Further, an output transition count is the number of state transitions from a detected transition-end state that is regarded as a transition-start state.

For example, in the FSM model 100 in FIG. 1, the detected transition-end state is assumed to be the state S3. The state S3 is the transition-end state from the state S1 and does not transition from any other state. Thus, the input transition count for the state S3 is 1. Further, the state S3 transitions to 3 states, states S6, S7, and S8; and thus, the output transition count for the state S3 is 3.

The determining unit 504 determines a transition-end state to be subject to recording/restoration if the output transition count identified by the transition count identifying unit 503 is greater than the input transition count. Here, a record/restore subject is a state (a value retained in a register) that is recorded to the database 420 and read out from the database 420 to be restored. In the example above where the state S3 is the detected transition-end state, since the output transition count (3) for the state S3 is greater than the input transition count (1) for the state S3, the state S3 becomes a record/restore subject as depicted in (B) of FIG. 1.

The embedding unit 505 embeds as an element subsequent to the element selected in the selected test scenario, record-instruction information for recording the record/restore subject determined by the determining unit 504, to the database 420. Here, record-instruction information is information to record to the database 420, a state that is a record/restore subject. In the present embodiment, for a state Si regarded as a record/restore subject, "record(Si)" is the record-instruction information. The embedding unit 505 embeds record-instruction information in a subsequent element of an element causing state transition to a record/restore subject in a test-scenario-under-test.

Figure 6:
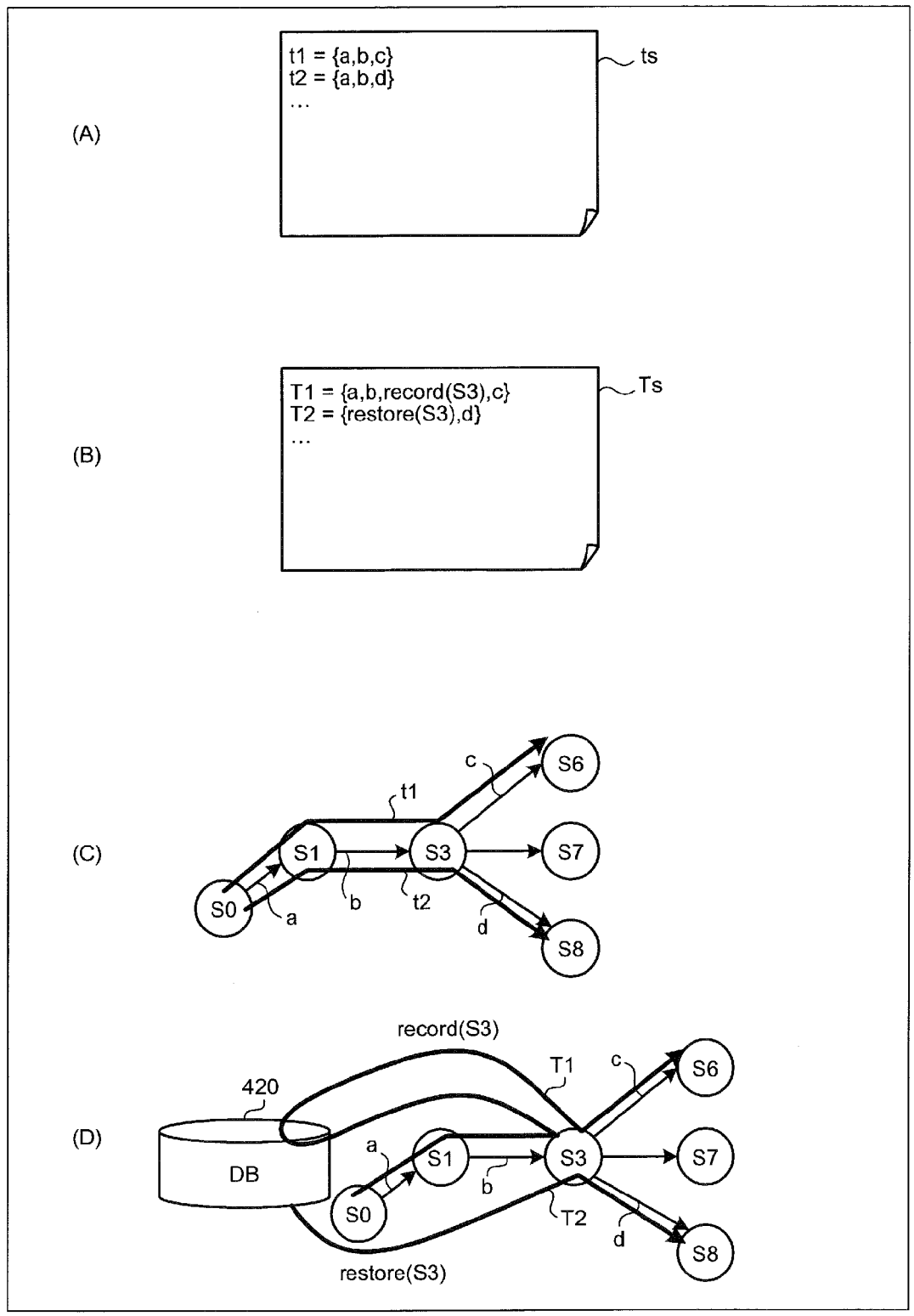
FIG. 6 is a schematic depicting before and after embedding relations for a test scenario in an FSM model.

FIG. 6 is a schematic depicting before and after embedding relations for a test scenario in the FSM model. In FIG. 6, (A) depicts the test scenario ts before embedding and (B) depicts the reduced test scenario Ts after embedding. (C) depicts details of a simulation executed using the test scenario ts before embedding and (D) depicts details of a simulation executed using the reduced test scenario Ts after embedding.

As depicted in (C), for the state S3 in test scenario t1, the output transition count is 3 and the input transition count is 1. Accordingly, as a subsequent element to the element b of the test scenario t1 and upstream to the element c, the embedding unit 505 embeds "record(S3)" as an element. Consequently, as depicted in (D), the test scenario t1 is converted to the test scenario T1.

Further, in FIG. 5, the embedding unit 505 embeds in another test scenario, restore-instruction information for restoring a record/restore subject from the database 420, to substitute an element group from the head element of a series of elements making up another test scenario to another selected element. Here, restore-instruction information is information to restore from the database 420, a state that is a record/restore subject.

In the present embodiment, "restore(Si)" is the restore-instruction information for a state Si regarded as a record/restore subject. The embedding unit 505 deletes from the test-scenario-under-test, a string of elements up to the record/restore subject and embeds restore-instruction information in place of the string of elements.

As depicted in (A), the element string {a, b} is redundant in the test scenarios t1 and t2. Thus, the transition-end state S3 for element b is designated by record-instruction information in the test scenario T1. Accordingly, the embedding unit 505 deletes the element string {a, b} from the initial element a to the element b of the test scenario t2 and embeds at the position of the element string {a, b}, "restore(S3)" as an element; whereby the test scenario t2 is converted to the test scenario T2.

Further, in FIG. 5, if a transition-end state for an element selected from a series of elements making up a test scenario other than the selected test scenario is detected by the detecting unit 502, the record/restore determining unit 506 determines whether the detected transition-end state coincides with the record/restore subject designated by the record-instruction information embedded in the selected test scenario by the embedding unit 505

Specifically, for example, as depicted in FIG. 6, after the test scenario t1 is converted to the test scenario T1, if the test scenario t2, which has not been converted, is selected, transition-end states are retrieved sequentially from the head element a of the test scenario t2 and the record/restore determining unit 506 determines whether each retrieved state matches the record/restore subject (state S3) designated by the record-instruction information "record(S3)".

In the test scenario t2, the transition-end state S3 for the element b matches the record/restore subject (state S3) designated by the record-instruction information "record(S3)". Accordingly, as depicted in (B) of FIG. 6, the element string {a, b} of the test scenario t2 is deleted and "restore(S3)" is embedded as an element in the position of the element string {a, b}.

Thus, as depicted in (C) of FIG. 6, conventionally, when the test scenario t1 is used to simulate the circuit-under-test, state transitions occur in the sequence of a→b→c and thereafter, when the test scenario t2 is used to simulate the circuit-under-test, state transitions occur in the sequence of a→b→d.

On the contrary, in the present embodiment, as depicted in (D) of FIG. 6, when the test scenario T1 is used to simulate the circuit-under-test, state transitions occur in the sequence of a→b and thereafter, the transition-end state S3 (register value) for the element b is recorded to the database 420 according to the record-instruction information "record(S3)" and state transition is cause by c.

Next, the circuit-under-test is simulated using the test scenario T2 without the state transition of a→b as with the test scenario t2, and the state S3 (register value) is restored from the database 420 according to the restore-instruction information "restore(S3)". Subsequently, state transition is caused by element d. As a result, simulation time is greatly decreased.

Figure 7:
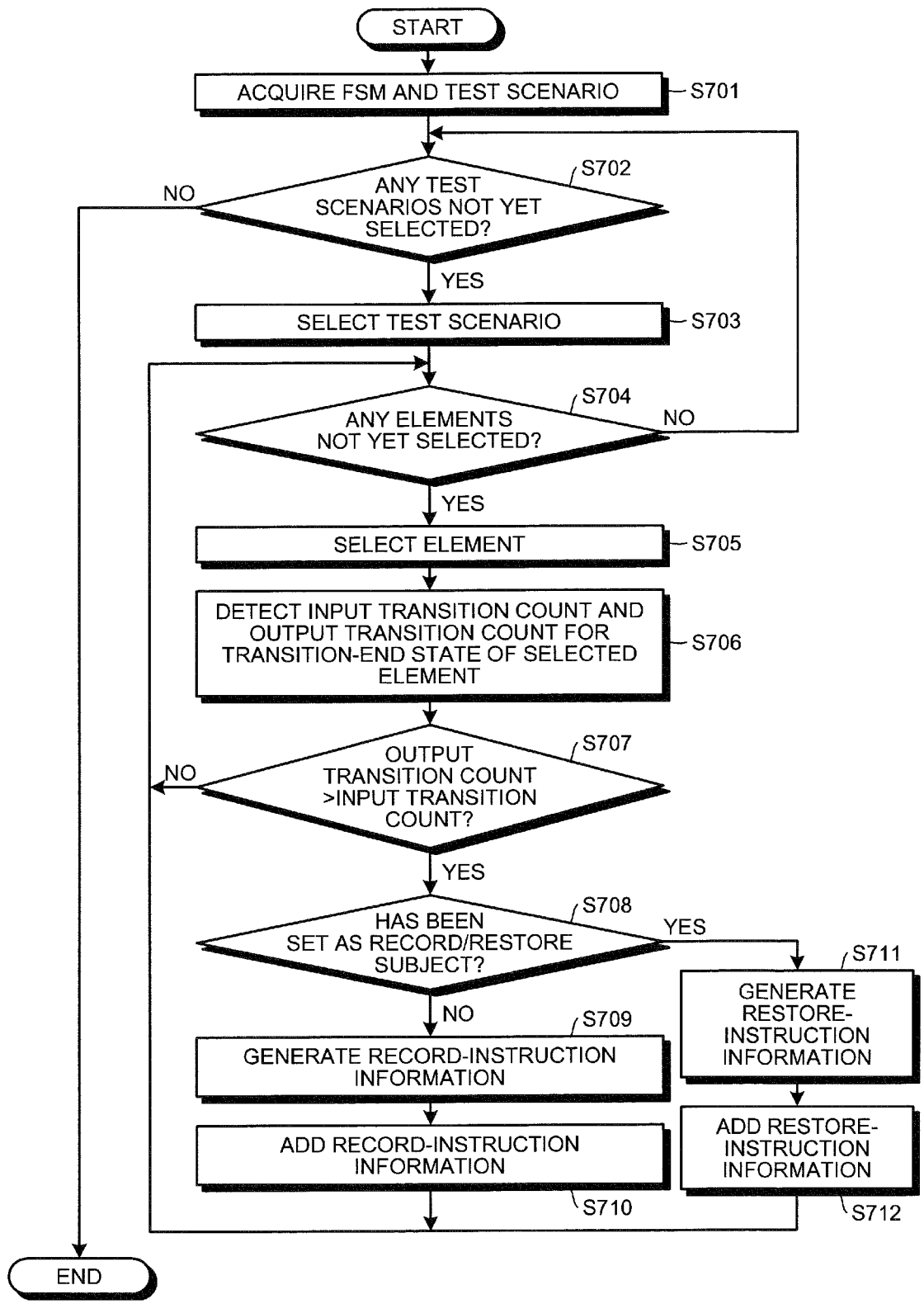
FIG. 7 is a flowchart of a test scenario reduction processing procedure by the test-scenario-reducing processor.

FIG. 7 is a flowchart of a test scenario reduction processing procedure by the test-scenario-reducing processor 401. The test-scenario-reducing processor 401 acquires the FSM model 100 related to a circuit-under-test and a test scenario group ts related to the circuit-under-test (step S701). Specifically, the test-scenario-reducing processor 401 reads into the verification support apparatus 400, the FSM model 100 and the test scenario group ts related to the circuit-under-test.

Subsequently, the test-scenario-reducing processor 401 determines whether any test scenarios that have not been selected remain (step S702). If no test scenario remains (step S702: NO), the test scenario reduction processing ends. On the other hand, if test scenarios remain (step S702: YES), the test-scenario-reducing processor 401 selects a test scenario (step S703). The test-scenario-reducing processor 401 determines whether any elements that have not been selected remain in the selected test scenario (step S704).

If no element remains (step S704: NO), flow returns to step S702 for the test-scenario-reducing processor 401 to select the next test scenario. On the other hand, if elements remain (step S704: YES), the test-scenario-reducing processor 401 selects the head element among the remaining elements (step S705).

The test-scenario-reducing processor 401 detects the input transition count and the output transition count for the transition-end state of the selected element (step S706). The test-scenario-reducing processor 401 determines whether the output transition count>the input transition count is true (step S707). If the output transition count>the input transition count is not true (step S707: NO), the selected element is not a record/restore subject and thus, the flow returns to step S704. On the other hand, if the output transition count>the input transition count is true (step S707: YES), the test-scenario-reducing processor 401 determines whether the transition-end state has been set as the record/restore subject (step S708).

For example, the test-scenario-reducing processor 401 makes the determination based on whether the transition-end state is designated by the record-instruction information in a previously selected test scenario. If the transition-end state is not designated, the transition-end state has not been set and if designated, the transition-end state has been set. For example, if "record(S3)" has already been embedded in a previously selected test scenario, the transition-end state S3 has been set as a record/restore subject.

If the transition-end state has not been set (step S708: NO), the test-scenario-reducing processor 401 generates record-instruction information to designate as a record/restore subject and to record the transition-end state in the database 420 (step S709). The test-scenario-reducing processor 401 adds the generated record-instruction information between the selected element and the element subsequent to the selected element (step S710), and the flow returns to step S704.

On the other hand, at step S708, if the transition-end state has been set (step S708: YES), record-instruction information designating the transition-end state already exists. Thus, the test-scenario-reducing processor 401 generates restore-instruction information to restore the transition-end state from the database 420 (step S711). The test-scenario-reducing processor 401 deletes the transition string up to the transition-end state and at that position, adds the generated restore-instruction information (step S712) and subsequently, the flow returns to step S704.

By such test scenario reduction processing, the test scenario group is (t1, t2, . . . ) is reduced to the reduced test scenario group Ts (T1, T2, . . . ).

The FSM verifying processor 403 depicted in FIG. 4 will be described in detail. The FSM verifying processor 403 verifies coincidence of a state transition in the FSM model 100 related to the circuit-under-test and a state transition occurring during actual simulation. Specifically, by sequentially providing test scenarios in the reduced test scenario group Ts to the hardware description information of the circuit-under-test, the FSM verifying processor 403 verifies whether a state transition during simulation and a state transition of the FSM model 100 related to the circuit-under-test coincide.

Figure 8:
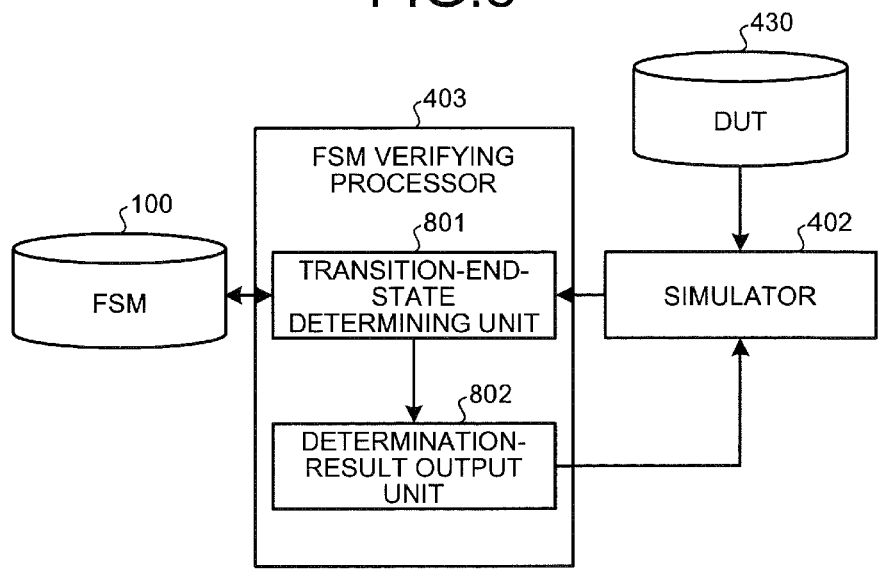
FIG. 8 is a block diagram of a functional configuration of an FSM verifying processor.

FIG. 8 is a block diagram of a functional configuration of the FSM verifying processor 403. The FSM verifying processor 403 includes a transition-end-state determining unit 801 and a determination-result output unit 802.

The transition-end-state determining unit 801 determines whether the transition-end state resulting from a state transition at an element-under-test and consequent to simulation of the circuit-under-test and the transition-end state for the element-under-test in the FSM model 100 related to the circuit-under-test coincide.

Specifically, for example, if the test scenario T1 is provided and simulation is executed, assuming that the transition-end state of the current state S0 is the state S1 in the FSM model 100, if the subsequent state of the current state S0 during simulation is the state S1, the transition-end states are determined to coincide. On the other hand, if the subsequent state is a state other than the state S1, e.g., the state S2, the transition-end states are determined to not coincide.

The determination-result output unit 802 outputs the determination result obtained by the transition-end-state determining unit 801. The determination result is output as a report of passing, if the transition-end states coincide according to the transition-end-state determining unit 801. On the other hand, if the transition-end-state determining unit 801 determines that the transition-end states do not coincide, the determination-result output unit 802 outputs, for the simulation, terminate-instruction information to the simulator 402. The simulator 402, upon receiving terminate-instruction information, terminates the simulation.

In this case, since inconsistency arises between the reduced test scenario Ts and the FSM model 100, the design engineer operates a computer to manually correct the reduced test scenario Ts (or the test scenario ts) and the FSM model 100. After correction, verification processing by the FSM verifying processor 403 resumes.

Figure 9:
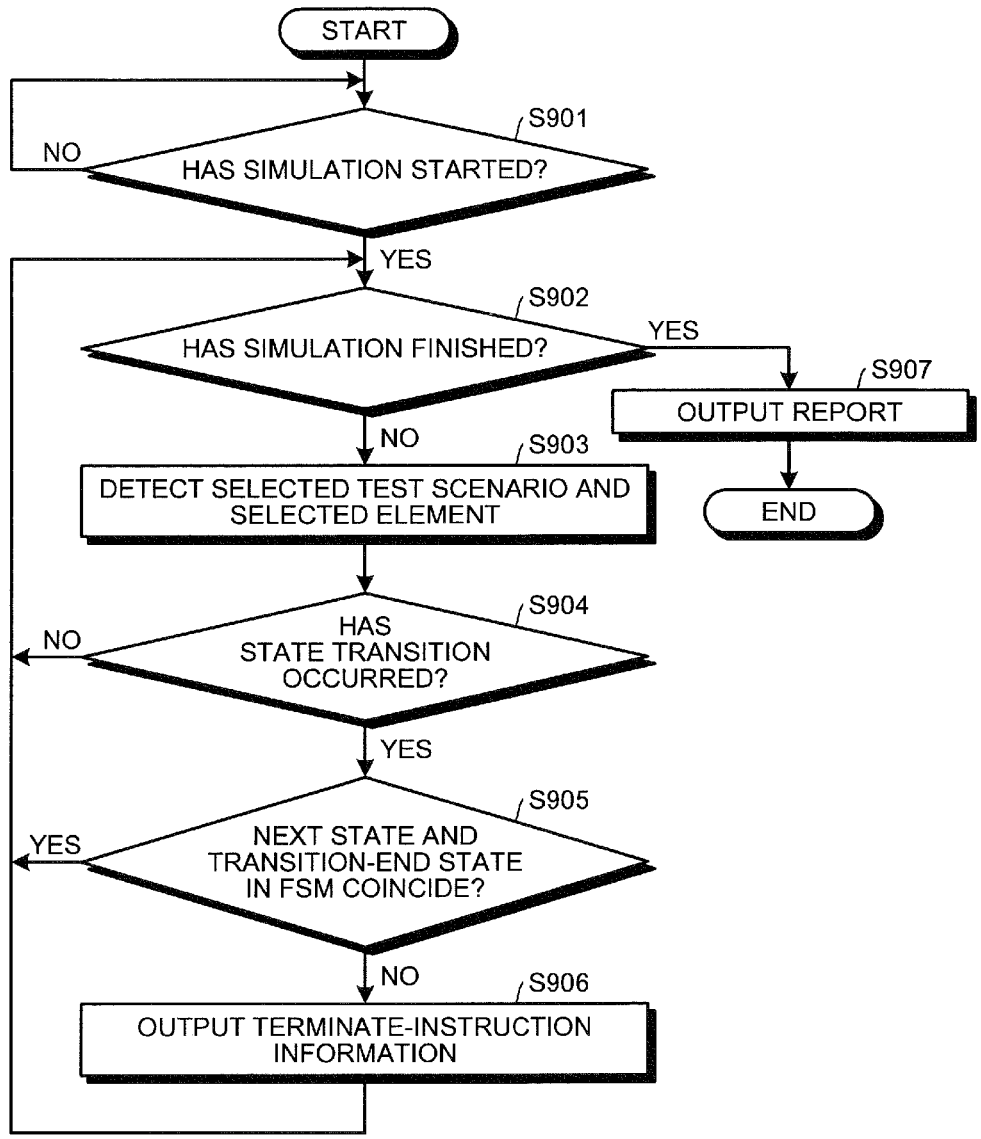
FIG. 9 is a flowchart of a FSM verification processing procedure by the FSM verifying processor.

FIG. 9 is a flowchart of a FSM verification processing procedure by the FSM verifying processor 403. The FSM verifying processor 403 waits for simulation to start (step S901: NO) and when simulation starts (step S901: YES), the FSM verifying processor 403 waits for the simulation to finish (step S902). The simulation may be completed without any problems or the simulation may be terminated as a result of terminate-instruction information being output from the FSM verifying processor 403 to the simulator 402.

If the simulation has not finished (step S902: NO), the FSM verifying processor 403 detects the selected test scenario used for the simulation and the concerned selected element using information from the simulator 402 (step S903). The FSM verifying processor 403 determines whether state transition has occurred using the information from the simulator 402 (step S904). If state transition has not occurred (step S904: NO), the flow returns to step S902.

On the other hand, if state transition has occurred (step S904: YES), the FSM verifying processor 403 determines whether the next state and the transition-end state in the FSM model 100 coincide (step S905). If the states coincide (step S905: YES), the flow returns to step S902. If the states do not coincide (step S905: NO), the FSM verifying processor 403 outputs terminate-instruction information to the simulator 402 (step S906), and the flow returns to step S902.

At step S902, if the simulation has finished (step S902: YES), the FSM verifying processor 403 outputs a report of the verification results (pass or fail) (step S907). If terminate-instruction information is not output, not even once, a report indicating passing is output. On the other hand, if terminate-instruction information has been output, a report indicating failure is output.

By such FSM verification processing, inconsistencies between the generated reduced test scenario group Is and the FSM model 100, which are independent, are automatically detected. Furthermore, if there are no inconsistencies (no discrepancy), consistency between the reduced test scenario Is and the FSM model 100 is assured.

The recording/restoring processor 404 depicted in FIG. 4 will be described in detail. The recording/restoring processor 404, during simulation, identifies transition-end states that are to be record/restore subjects, records the transition-end states (register values) to the database 420 and, reads from the database 420 and restores the recorded transition-end states.

Figure 10:
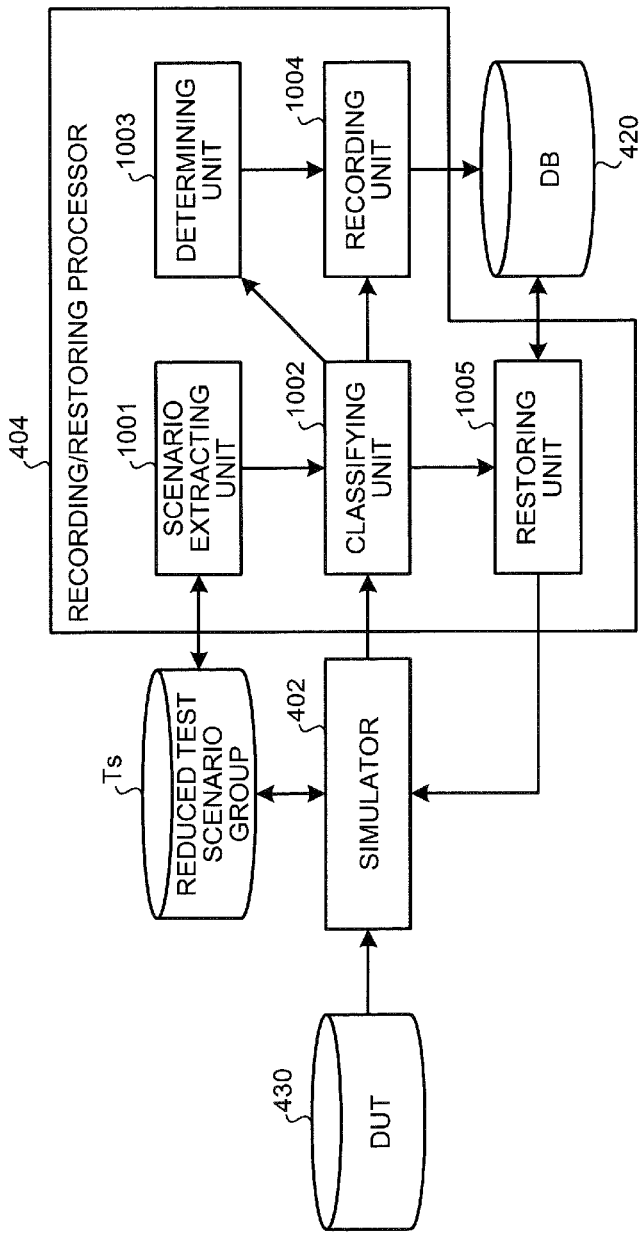
FIG. 10 is a block diagram of a functional configuration of a recording/restoring processor.

FIG. 10 is a block diagram of a functional configuration of the recording/restoring processor 404. The recording/restoring processor 404 includes a scenario extracting unit 1001, a classifying unit 1002, a recording unit 1004, a determining unit 1003, and a restoring unit 1005.

The scenario extracting unit 1001 extracts a test-scenario-under-test to be used in a simulation of the circuit-under-test, from a test scenario group that includes test scenarios embedded with record-instruction information to record a designated transition-end state to the database 420 and test scenarios embedded with restore-instruction information to restore a designated ending transition state.

Specifically, for example, the scenario extracting unit 1001 sequentially extracts from the reduced test scenario group Ts, test scenarios-under-test to be used in the simulation of the circuit-under-test.

The classifying unit 1002 classifies the type of the element-under-test, during simulation of the circuit-under-test, which is simulated by sequentially providing to the circuit-under-test, elements-under-test from a series of elements making up the test-scenario-under-test extracted by the scenario extracting unit 1001. Specifically, for example, test scenarios making up the reduced test scenario group Ts include the test scenario T1 embedded with record-instruction information and the test scenario T2 embedded with restore-instruction information.

The classifying unit 1002 classifies the type of each element-under-test provided to the circuit-under-test from the test-scenario-under-test, to be an element that represents the transition (Sj→Sk), record-instruction information record (Sk), or restore-instruction information restore(Sk).

The recording unit 1004 records the designated transition-end state to the database 420, if the classifying unit 1002 classifies the element-under-test to be record-instruction information. Specifically, for example, if the record-instruction information is "record(Sk)", the state Sk, i.e., the register value output from a combinational circuit in the circuit-under-test, is correlated to the identifier of the state Sk and stored to the database 420.

Figure 11:
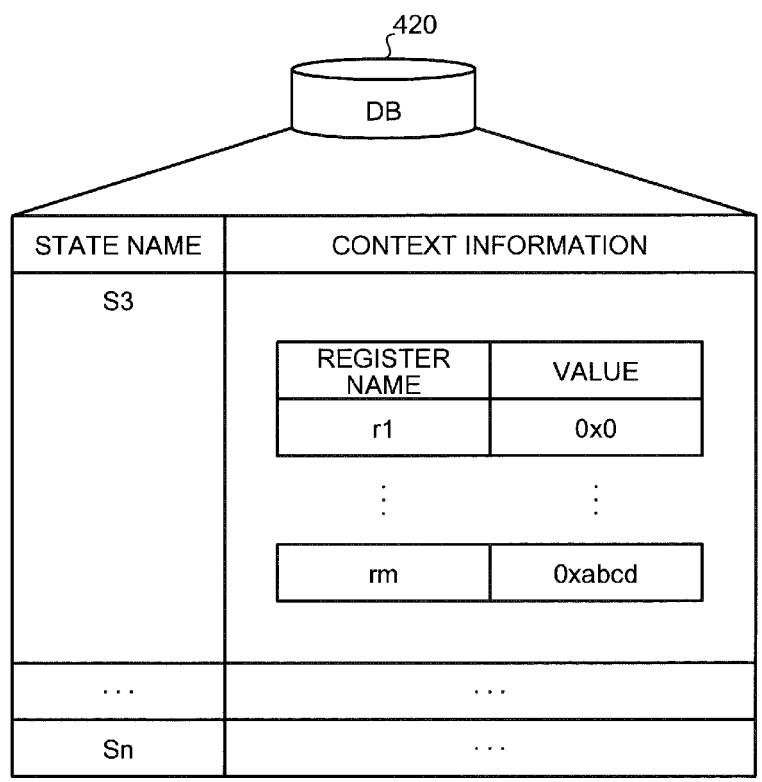
FIG. 11 is a diagram of one example of the contents of a database.

FIG. 11 is a diagram of one example of the contents of the database 420. The database 420 includes state names and context information that is recorded for each state. Here, context information is an identifier (e.g., register name) identifying a register in the circuit-under-test. In FIG. 11, values in registers r1 to rm for the state S3 are recorded.

The reference of description returns to FIG. 10. The determining unit 1003, based on the time for simulation up to a designated transition-end state and a given restoration time for restoration from the database 420, determines whether the recording unit 1004 is to record, if the classifying unit 1002 classifies an element-under-test to be record-instruction information.

Here, the time for simulation up to a designated transition-end state is measured by the simulator 402. For example, the simulation time for the states S0 to Sk is the SimTime (S0→Sk). Further, the time for recording to the database 420 is Rec and the time for restoration from the database 420 is Res, where the recording time Rec and the restoring time Res are set in advance.

In this example, transition count difference $N(Sk)$ for a designated transition-end state Sk is obtained. The transition count difference $N(Sk)$ is expressed by the expression below.

$$N(Sk)=Nout(Sk)-Nin(Sk) \qquad (2)$$

Where, $Nout(Sk)$ is the output transition count for the transition-end state Sk and $Nin(Sk)$ is the input transition count for the transition-end state Sk.

Further, by satisfying expression (3), it is determined whether the transition-end state Sk is to be recorded to the database 420.

$$N(Sk) \times SimTime(S0 \rightarrow Sk) > Rec + N(Sk) \times Res \quad (3)$$

Where, $N(Sk) > 0$.

Since simulations are typically executed multiple times, the state Sk is designated so that the simulation time for the first simulation is the shortest. For the second and subsequent simulations, the SimTime(S0→Sk) of the state Sk affording the shortest simulation time is applied. For example, if test scenarios t1 to t3 pass through the same state S10, for each of the test scenarios t1 to t3, the SimTime(S0→S10) is measured.

In the second and subsequent simulations, the SimTime (S0→S10) of the test scenario (e.g., test scenario t2) affording the shortest SimTime(S0→S10) is adopted. In this case, expression (3) above becomes expression (4) below.

$$N(Sk) \times Min[SimTime(S0 \rightarrow Sk)] > Rec + N(Sk) \times Res \quad (4)$$

Where, $N(Sk) > 0$.

The greater N(Sk) is, the greater the second term on the right N(Sk)×Res becomes. Thus, the first term on the right recording time Rec can be disregarded. Therefore, if the N(Sk) is equal to or greater than a threshold set in advance, expression (4) above becomes expression (5) below.

$$Min[SimTime(S0 \rightarrow Sk)] > Res \quad (5)$$

Thus, when expression (5) is satisfied, the determining unit 1003 determines that the concerned transition-end state is to be recorded to the database 420 and if the expression is not satisfied, determines that the transition-end state is not to be recorded.

The restoring unit 1005 restores a designated transition-end state from the database 420, if the classifying unit 1002 determines the element-under-test to be restore-instruction information. Here, restoration is processing involving the reading of a designated transition-end state (register value) from the database 420 and the writing of the transition-end state to a register of the circuit-under-test. Since the present embodiment concerns simulation, the register value read from the database 420 is set in the register of a model of the circuit-under-test.

Specifically, for example, in (D) of FIG. 6, for a simulation executed by providing test scenario T2, without executing the simulation up to the state 3, the state S3 is restored. Thus, by restoring a designated transition-end state, it is not necessary to execute simulation up to the designated transition-end state, facilitating a reduction in the simulation time.

For example, if the minimum simulation time Min[SimTime(S0→Sk)] for simulation up to a designated transition-end state Sk is greater than the restoring time Res, the difference is for example 1 msec. Further, if the transition count difference N(Sk) is N(Sk)=1000, after reduction, for a test scenario group passing through the designated transition-end state Sk, the simulation time can be reduced by 1000× 1[msec]=1[sec].

Figure 12:
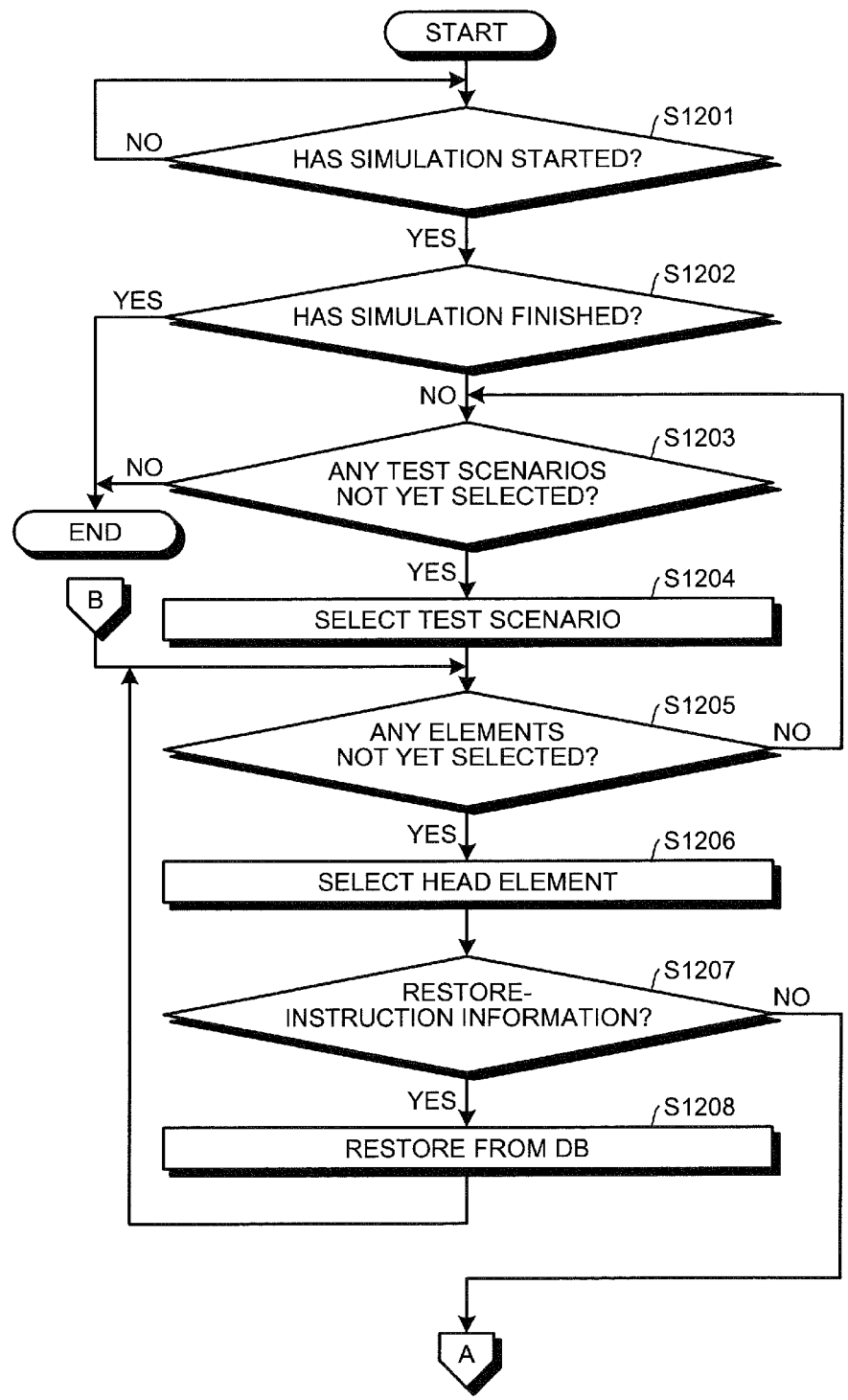
FIG. 12 is a flowchart of a record/restore processing procedure by the recording/restoring processor (part 1).

FIG. 12 is a flowchart of a record/restore processing procedure by the recording/restoring processor 404 (part 1). The recording/restoring processor 404 waits for the simulation to start (step S1201: NO) and when the simulation starts (step S1201: YES), waits for the simulation to finish (step S1202). The simulation may be completed without any problems or the simulation may be terminated as a result of terminate-instruction information being output from the FSM verifying processor 403 to the simulator 402. If the simulation has finished (step S1202: YES), record/restoring processing comes to an end.

If the simulation has not finished (step S1202: NO), the recording/restoring processor 404 determines whether there are any test scenarios that have yet be selected from among the reduced test scenario group Is (step S1203). If no test scenario remains (step S1203: NO), the record/restore processing comes to an end.

If test scenarios remain (step S1203: YES), the recording/restoring processor 404 selects a test scenario (step S1204). The recording/restoring processor 404 determines whether there are any elements that have yet to be selected in the selected test scenario (step S1205). If no element remains (step S1205: NO), the flow returns to step S1203 since all of the elements in the selected test scenario have been simulated.

If elements remain (step S1205: YES), the recording/restoring processor 404 extracts an element from the head of the remaining elements (step S1206). The recording/restoring processor 404 determines whether the extracted element is restore-instruction information (step S1207). If the element is restore-instruction information (step S1207: YES), the recording/restoring processor 404 reads from the database 420, the context information for the state designated by the restore-instruction information and restores the state (step S1208), and the flow returns to step S1205.

At step S1207, if the element is not restore-instruction information (step S1207: NO), the flow proceeds to step S1301 depicted in FIG. 13.

Figure 13:
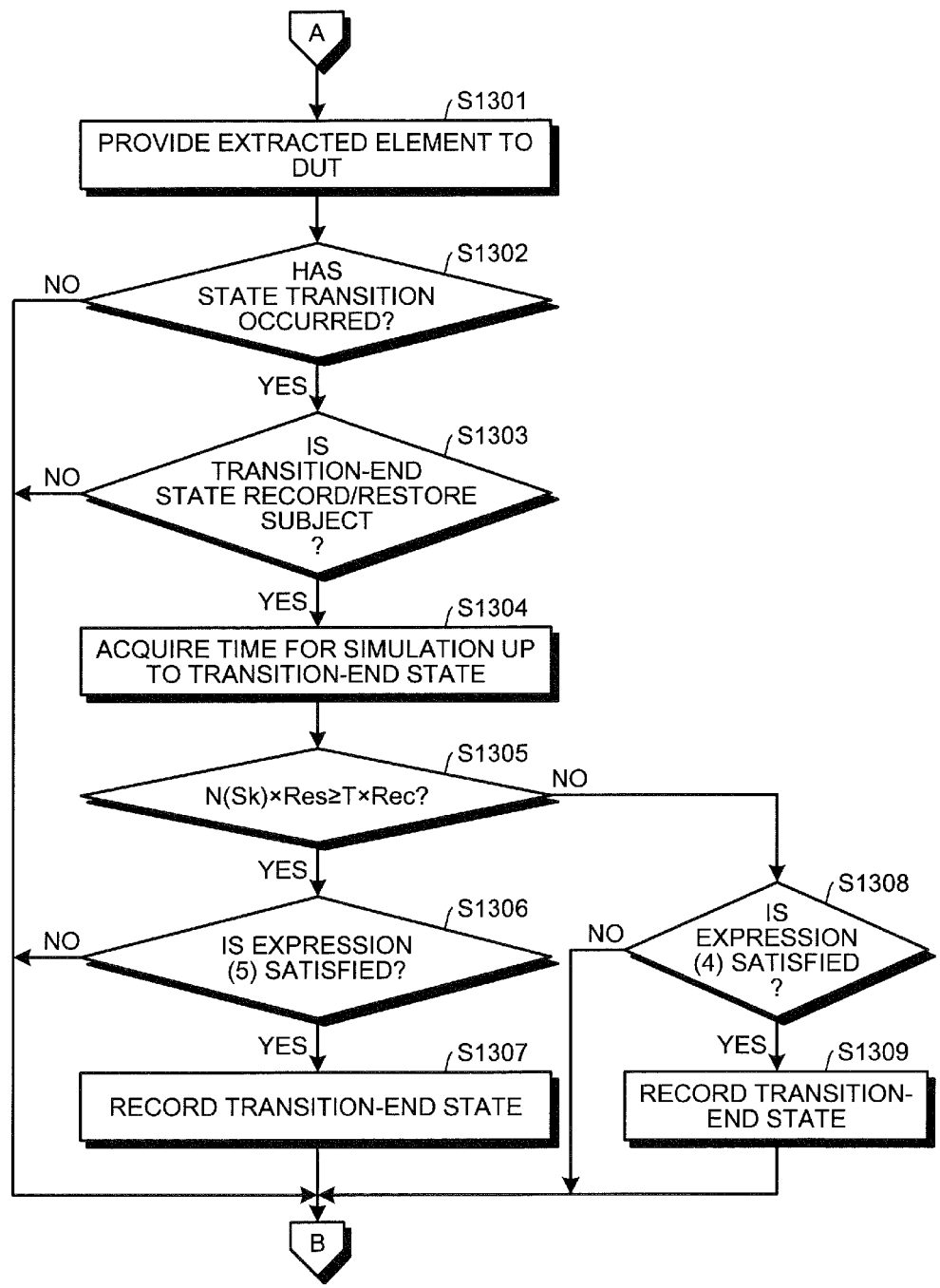
FIG. 13 is a flowchart of the record/restore processing procedure by the recording/restoring processor (part 2).

FIG. 13 is a flowchart of the record/restore processing procedure by the recording/restoring processor 404 (part 2). The recording/restoring processor 404 provides the element extracted at step S1206 to the hardware description information for the circuit-under-test (step S1301). Consequently, at the simulator 402, simulation of the circuit-under-test is executed and the recording/restoring processor 404 waits for the occurrence of a state transition (step S1302).

If no state transition occurs (step S1302: NO), the last state has been reached and notification indicating such is received from the simulator 402, in which case the flow returns to step S1205. In this case, even if the flow returns to step S1205, since there are no elements that have not yet been selected, the flow returns to step S1203. State transition from the current state to the next state is regarded as an occurrence of a state transition.

At step S1302, if a state transition has occurred (step S1302: YES), the recording/restoring processor 404 determines whether the transition-end state Sk resulting from the state transition is a record/restore subject (step S1303). Specifically, the recording/restoring processor 404 determines whether the transition state Sk is designated by record-instruction information already in another test scenario.

If the transition-end state is not a record/restore subject (step S1303: NO), the flow returns to step S1205. On the other hand, if the transition-end state is a record/restore subject (step S1303: YES), the recording/restoring processor 404 acquires from the simulator 402, the time needed for simulation from the initial state S0 to the transition-end state Sk (step S1304). The recording/restoring processor 404 then determines whether the transition count difference N(Sk) for the transition-end state Sk multiplied by the restore-time Res is at least equal to a given threshold T multiplied by the record-time Rec (step S1305).

If $N(Sk) \times Res \geq T \times Rec$ is true (step S1305: YES), the recording/restoring processor 404 determines whether expression (5) is satisfied (step S1306). If expression (5) is not satisfied (step S1306: NO), the flow returns to step S1205. On the other hand if expression (5) is satisfied (step S1306: YES), the recording/restoring processor 404 records the transition-end state Sk to the database 420 as context information (step S1307) and the flow returns to step S1205.

At step S1305, if N(Sk)×Res≥T×Rec is not true (step S1305: NO), the recording/restoring processor 404 determines whether expression (4) is satisfied (step S1308). If expression (4) is not satisfied (step S1308: NO), the flow returns to step S1205. If expression (4) is satisfied (step S1308: YES), the recording/restoring processor 404 records the transition-end state Sk to the database 420 as context information (step S1309), and the flow returns to step S1205.

By such record/restore processing, the states that are to be restored are automatically set and thus, the design engineer need not search for record/restore subjects by trial and error, thereby enabling efficient shortening of the simulation of the circuit-under-test.

Next, a second embodiment will be described. In the first embodiment above, an example was described where the design engineer, for a circuit-under-test, generated both the test scenario ts and the FSM model 100. To preliminarily circumvent inconsistency between the test scenario ts and the FSM model 100, in the second embodiment, the FSM model 100 is automatically generated from the test scenario ts.

With automatic generation, since the same state may be generated as independent states, in the second embodiment, states that are actually the same but are generated separately are integrated to automatically correct the FSM model 100. Thus, the FSM model after correction (hereinafter, "corrected FSM") 1400 has less redundancy that before correction.

Further, integrated states may become record/restore subjects. Accordingly, since restoration of context information from the database 420 is possible, simulation time can be reduced. Hereinafter, the second embodiment will be described, and portions identical to those of the first embodiment are assigned the same reference numerals used in the first embodiment and description therefor is omitted.

Figure 14:
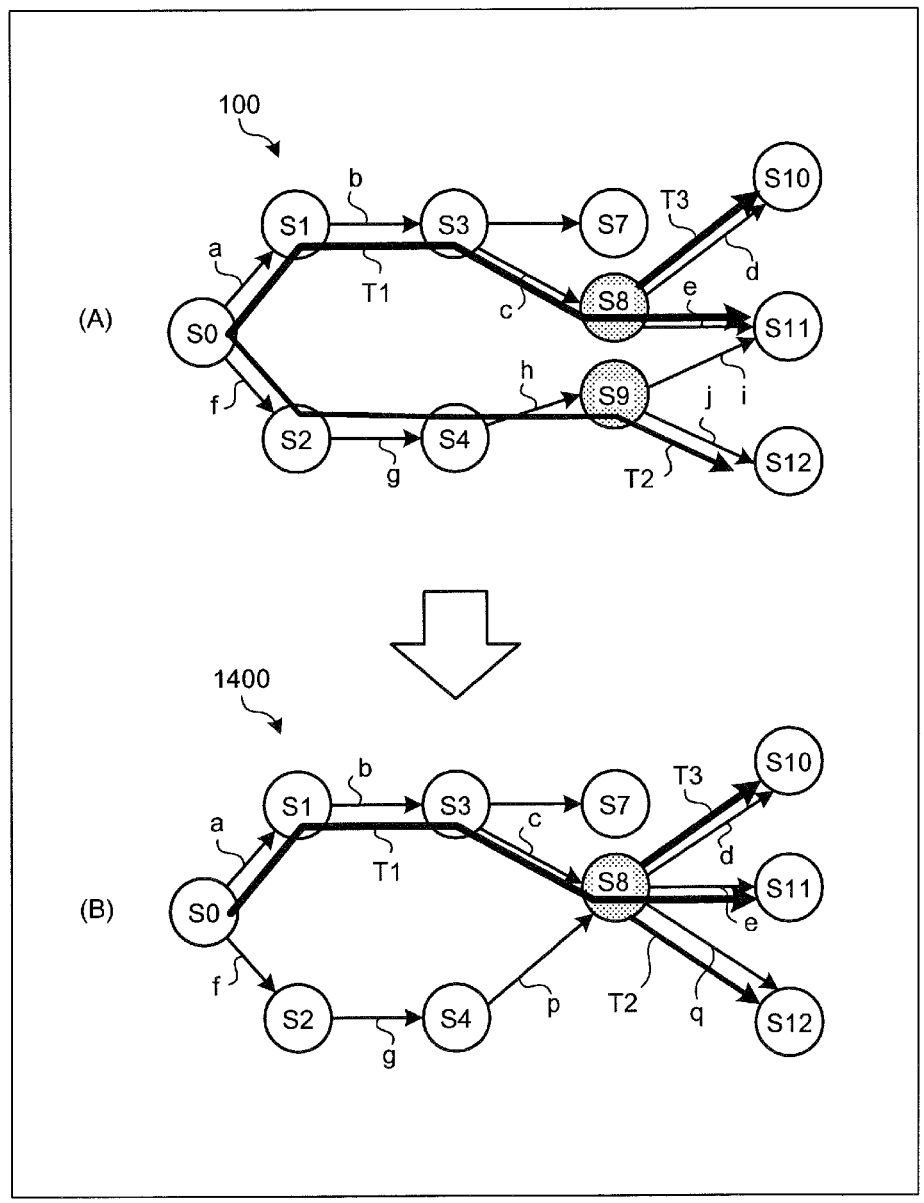
FIG. 14 is a schematic of an example of FSM model correction.

FIG. 14 is a schematic of an example of FSM model 100 correction. In FIG. 14, (A) depicts the FSM model 100 and (B) depicts the corrected FSM 1400.

The reduced test scenario Ts in the state depicted in (A) is as follows.
T1={a, b, c, record(S8), e}
T2={f, g, h, j}
T3={restore(S8), d}

Furthermore, correction of the reduced test scenario group Ts by the corrected FSM 1400 results in the following.
T1={a, b, c, record(S8), e}
T2={f, g, p, q}
T3={restore(S8), d}

In other words, since the state S9 is integrated with the state S8, the element h (S4→S9) of the test scenario T2 is corrected to the element p (S4→S8). Similarly, the element j (S9→S12) of the test scenario is corrected to the element q (S8→S12). Thus, by correcting the test scenarios, the test scenarios can be again reduced. For example, the test scenario T2 can be reduced by restoring the state S8 recorded in the database 420.

Figure 15:
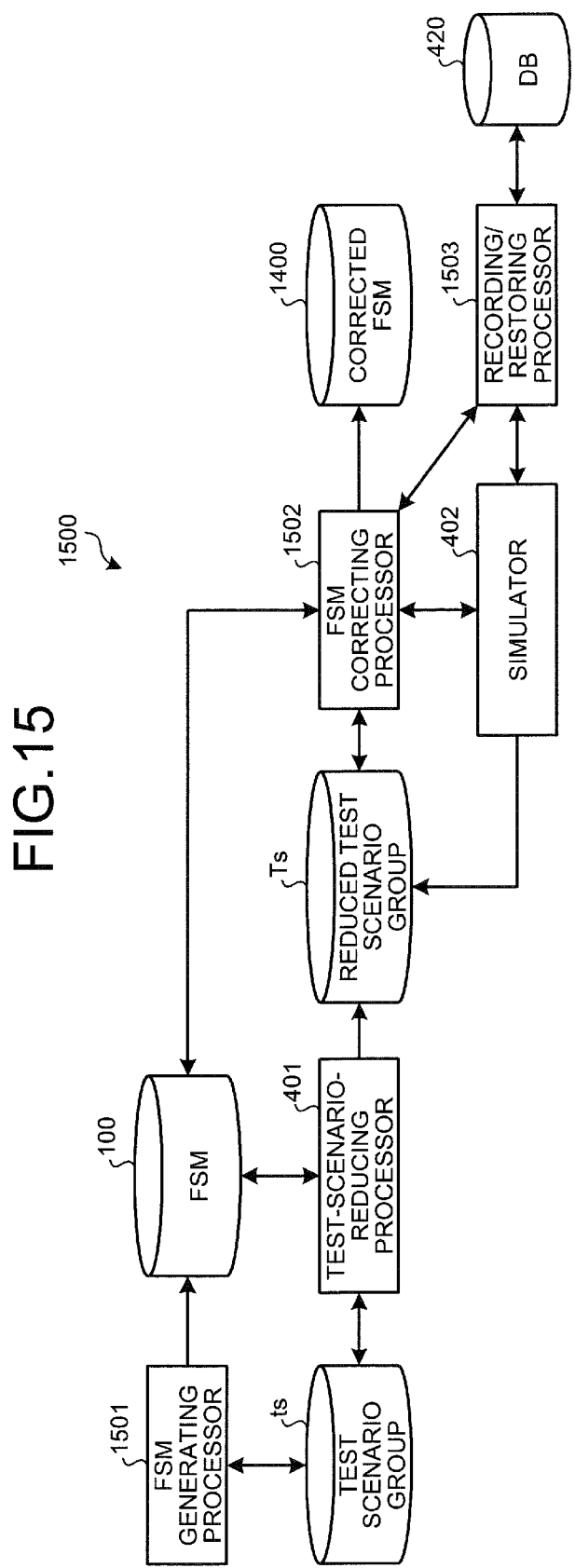
FIG. 15 is a block diagram of one example of a functional configuration of the verification support apparatus.

FIG. 15 is a block diagram of one example of a functional configuration of the verification support apparatus. A verification support apparatus 1500 includes an FSM generating processor 1501, the test-scenario-reducing processor 401, the simulator 402, an FSM correcting processor 1502, and a recording/restoring processor 1503. Details concerning the test-scenario-reducing processor 401 and the simulator 402 are identical to that in the first embodiment and description therefor is omitted.

Further, functions of the FSM generating processor 1501 to the recording/restoring processor 1503, specifically, for example, are implemented by an execution of programs by the CPU 301; the programs being stored in a storage apparatus such as the ROM 302, the RAM 303, the magnetic disk 305, and the optical disk 307 depicted in FIG. 3.

More specifically, data read out from a storage apparatus such as the ROM 302, the RAM 303, the magnetic disk 305, and the optical disk 307 by the FSM generating processor 1501 to the recording/restoring processor 1503 is written to the RAM 303, the magnetic disk 305, the cache of the CPU 301, or a register, etc. Further, intermediate or final results of execution by the CPU 301 are written to a storage apparatus, such as the ROM 302, the RAM 303, the magnetic disk 305, the optical disk 307, etc., the cache of the CPU 301 or a register, by the FSM generating processor 1501 to the FSM correcting processor.

The FSM generating processor 1501 automatically generates from the test scenario group is related to the circuit-under-test, the FSM model 100 for the circuit-under-test. Details concerning the FSM generating processor 1501 will be described using FIGS. 16 and 17.

As depicted in FIG. 14, the FSM correcting processor 1502, during simulation by the simulator 402, corrects the FSM model 100 generated by the FSM generating processor 1501 and further has function of recording to the database 420, states that are to be recorded (record subjects). Details concerning the FSM correcting processor 1502 will be described using FIGS. 18 and 19.

The recording/restoring processor 1503, during simulation, identifies the transition-end states that are to be record/restore subjects, records the transition-end states (register values) to the database 420, and from the database 420, reads and restores the recorded transition-end states.

Figure 16:
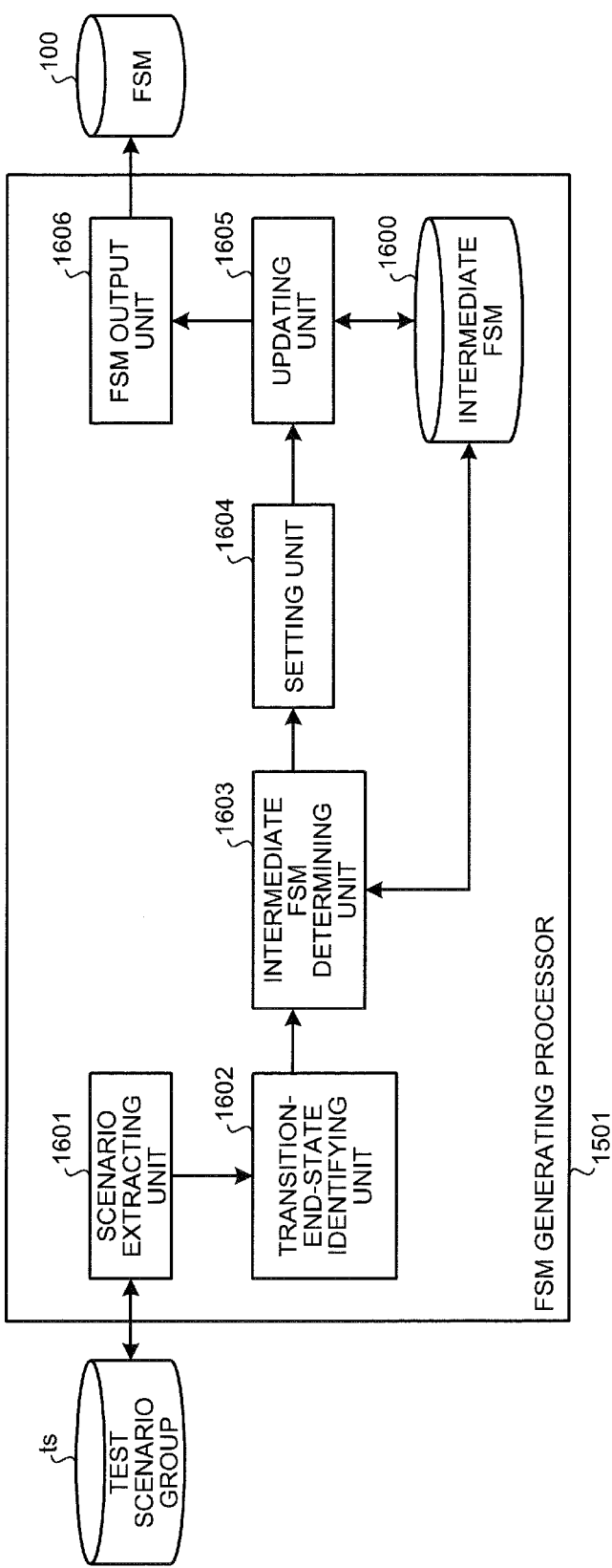
FIG. 16 is a block diagram of a functional configuration of a FSM generating processor.

FIG. 16 is a block diagram of a functional configuration of the FSM generating processor 1501. The FSM generating processor 1501 includes an updating unit 1605, a scenario extracting unit 1601, a transition-end state identifying unit 1602, an intermediate FSM determining unit 1603, a setting unit 1604, and an FSM output unit 1606.

The updating unit 1605, by an addition of the state-string-under-test to the FSM model 100 related to the circuit-under-test, updates the FSM model 100. The FSM model 100 that is subject to updating is referred to as an intermediate FSM 1600. If the intermediate FSM 1600 has not been updated, the intermediate FSM 1600 includes the initial state S0 of the circuit-under-test alone.

By an addition of the state-string-under-test to the intermediate FSM 1600, the intermediate FSM 1600 is updated. The state-string-under-test is a string of states that are not included in the intermediate FSM 1600 before updating. The state-string-under-test is set by the setting unit 1604.

The scenario extracting unit 1601 extracts an arbitrary test scenario from the test scenario group ts related to the circuit-under-test. Specifically, for example, test scenarios are extracted sequentially from the test scenario group ts.

The transition-end state identifying unit 1602 identifies a string of transition-end states resulting from state transitions of the test scenario extracted by the extracting unit. Specifically, for example, the transition-end state for each element of the extracted test scenario is detected (the transition-end state is a register value, but since the simulation has not yet been executed, may be a variable and not an actual value 0/1).

For example, if the selected test scenario is t1, i.e., t1={a, b, c, e} (where, a=(S0→S1), b=(S1→S3), c=(S3→S8), and e=(S8→S10)), the state transition string {S0→S1→S3→S8→S10} is set.

The intermediate FSM determining unit 1603 determines whether the transition-end state identified by the transition-end state identifying unit 1602 is included in the FSM model 100. Specifically, the intermediate FSM determining unit 1603 determines whether the transition-end state identified by the transition-end state identifying unit 1602 is included in the latest intermediate FSM 1600. For example, in the example above, if the latest intermediate FSM 1600 is {S0→S1}, of the state transition string {S0→S1→S3→S8→S10}, {S1→S3→S8→S10} is not included in the latest intermediate FSM 1600 {S0→S1}.

On the contrary, if the latest intermediate FSM 1600 is {S0→S1→S3→S8→S10→S15}, the state transition string {S0→S1→S3→S8→S10} is determined to be included in the latest intermediate FSM 1600 {S0→S1→S3→S8→S10→S15}.

The setting unit 1604 sets as the state-string-under-test causing addition to the FSM model 100, a transition-end state string that is in the transition-end state string identified by the transition-end state identifying unit 1602 and that is determined by the intermediate FSM determining unit 1603 to not be included in the latest intermediate FSM 1600. Specifically, in the example above, if the latest intermediate FSM 1600 is {S0→S1}, {S1→S3→S8→S10} of the state transition string {S0→S1→S3→S8→S10} is determined to not be included in the latest intermediate FSM 1600 {S0→S1}. Accordingly, the state transition string {S1→S3→S8→S10} is set as the state-string-under-test.

As a result, the updating unit 1605 adds the state-string-under-test {S1→S3→S8→S10} to the latest intermediate FSM 1600 {S0→S1}, whereby the intermediate FSM 1600 is updated and the latest intermediate FSM 1600 becomes {S0→S1→S3→S8→S10}.

The FSM output unit 1606, if there are no test scenarios that have yet to be extracted by the scenario extracting unit 1601, outputs the latest FSM model 100 updated by the updating unit 1605. Specifically, if all of the test scenarios have been extracted, the intermediate FSM 1600 has no need for updating. Accordingly, the latest intermediate FSM 1600 is output as a completed FSM model 100. The output FSM model 100, specifically, for example, is recorded to a storage apparatus, such as the ROM 302, the RAM 303, the magnetic disk 305, and the optical disk 307 depicted in FIG. 3.

Figure 17:
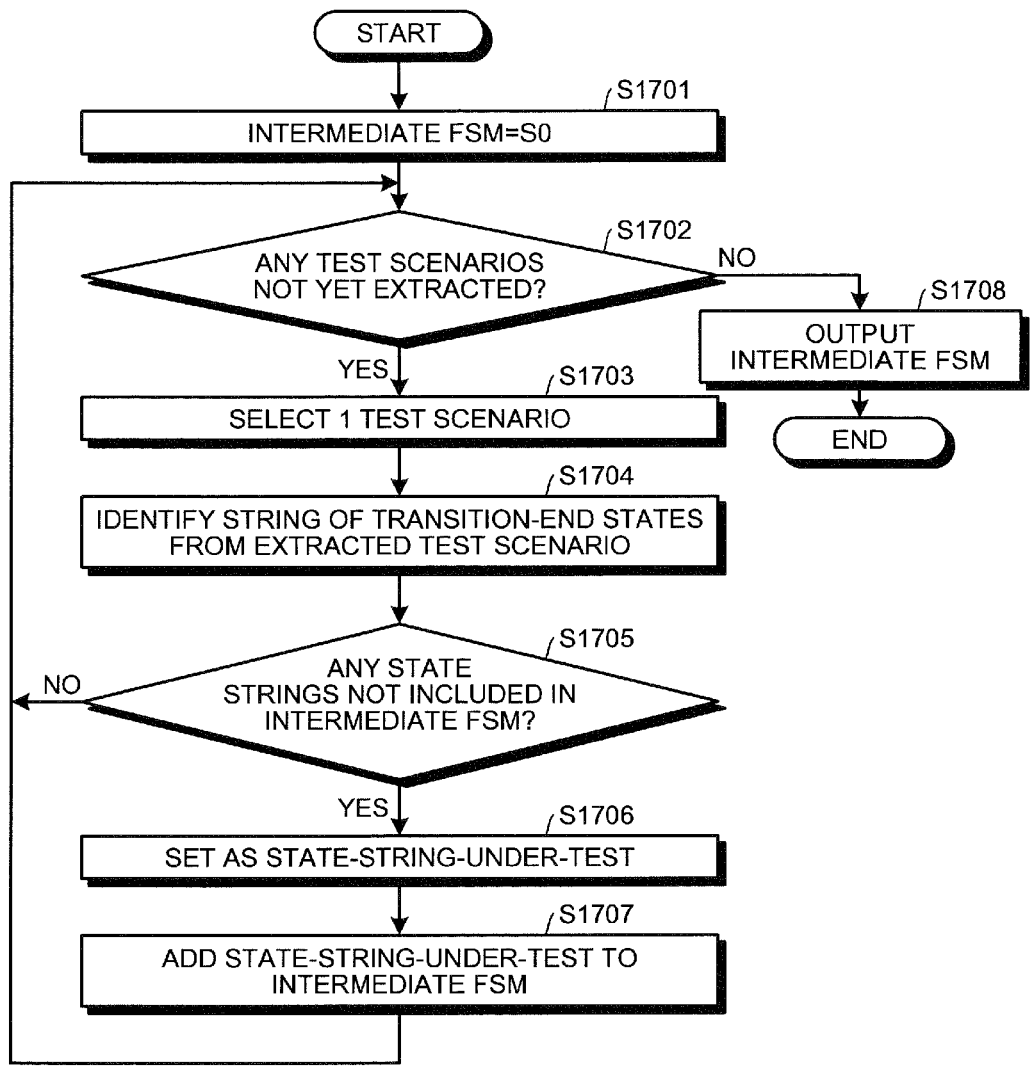
FIG. 17 is a flowchart of an FSM generation processing procedure by the FSM generating processor.

FIG. 17 is a flowchart of an FSM generation processing procedure by the FSM generating processor 1501. The FSM generating processor 1501 sets the initial state S0 as the intermediate FSM 1600 (step S1701). The FSM generating processor 1501 determines whether there are any test scenarios that have yet to be extracted from the test scenario group is by the scenario extracting unit 1601 (step S1702). If test scenarios remain (step S1702: YES), the FSM generating processor 1501 extracts 1 test scenario (step S1703).

At the FSM generating processor 1501, the transition-end state identifying unit 1602 identifies a string of transition-end states from the extracted test scenario (step S1704). Subsequently, at the FSM generating processor 1501, the intermediate FSM determining unit 1603 determines whether there are any state strings that are in the identified string of transition-end states and not included in the latest intermediate FSM 1600 (step S1705). If there are no state strings not included in the latest intermediate FSM 1600 (step S1705: NO), the flow returns to step S1702.

On the other hand, if there is a state string that is not included in the latest intermediate FSM 1600 (step S1705: YES), the FSM generating processor 1501, via the setting unit 1604, sets as the state-string-under-test, a state string that is in the identified string of transition-end states and not included in the latest intermediate FSM 1600 (step S1706). Subsequently, the FSM generating processor 1501, via the updating unit 1605, adds the state-string-under-test to the latest intermediate FSM 1600 (step S1707), whereby the intermediate FSM 1600 is updated.

Subsequently, the flow returns to step S1702. At step S1702, if there are no test scenarios that have yet to be extracted (step S1702: NO), the FSM generating processor 1501, via the FSM output unit 1606, outputs the latest intermediate FSM 1600 as a completed FSM model 100 (step S1708).

Thus, at the FSM generating processor 1501, through analysis of the test scenario group ts and additions to the intermediate FSM 1600, the size of the intermediate FSM 1600 snowballs, enabling generation of an FSM model 100 that encompasses the state transitions of test scenario group ts.

Figure 18:
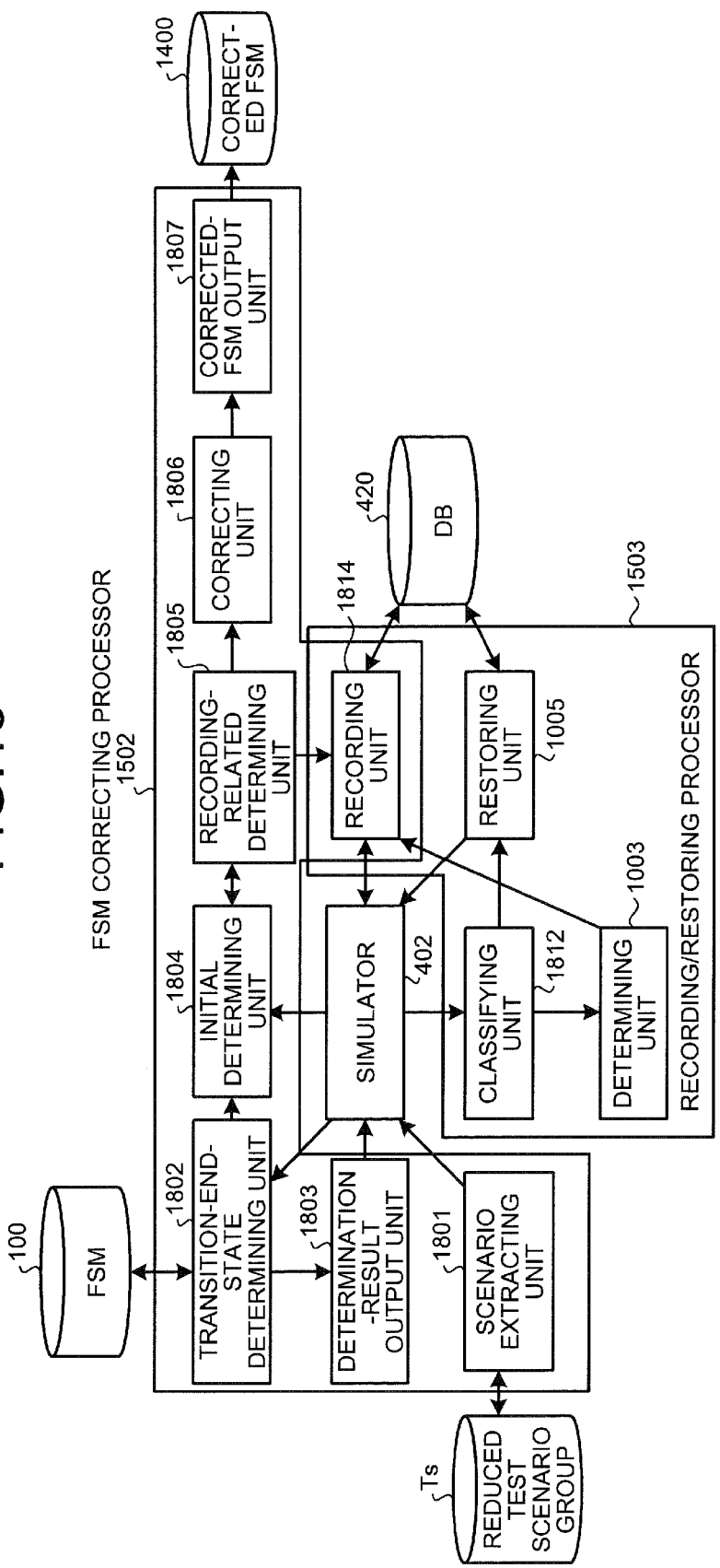
FIG. 18 is a block diagram of a functional configuration of an FSM correcting processor and the recording/restoring processor.

FIG. 18 is a block diagram of a functional configuration of the FSM correcting processor 1502 and the recording/restoring processor 1503. The FSM correcting processor 1502 includes a scenario extracting unit 1801, a transition-end-state determining unit 1802, a determination-result output unit 1803, an initial determining unit 1804, a recording-related determining unit 1805, a correcting unit 1806, a corrected-FSM output unit 1807, and a recording unit 1814.

The scenario extracting unit 1801 extracts from the reduced test scenario group Ts, a test scenario to be used for the simulation of the circuit-under-test. Specifically, for example, the scenario extracting unit 1801 extracts sequentially from the reduced test scenario group Ts, test scenarios to be used in the simulation of the circuit-under-test. When a test scenario is extracted, the extracted test scenario is provided to the simulator 402 to start the simulation.

The transition-end-state determining unit 1802 determines whether a transition-end state resulting from a state transition at an element-under-test and consequent to simulation of the circuit-under-test and a transition-end state for the element-under-test in the FSM model 100 generated by the FSM generating processor 1501 coincide.

Specifically, for example, if the test scenario T1 is provided and simulation is executed, with regard to the current state S0, assuming that the transition-end state of the current state S0 is the state S1 in the FSM model 100, if during simulation, the subsequent state of the current state S0 is the state S1, the transition-end states are determined to coincide. On the other hand, if the subsequent state is a state other than S1, e.g., the state S2, the transition-end states are determined to not coincide.

The determination-result output unit 1803 outputs the determination result obtained by the transition-end-state determining unit 1802. If the transition-end-state determining unit 1802 determines that the transition-end states do not coincide, the determination-result output unit 1803 outputs to the simulator 402, terminate-instruction information for the simulation. The simulator 402, upon receiving the terminate-instruction information, terminates simulation. On the other hand, if the transition-end-state determining unit 1802 determines that the transition-end states coincide, the initial determining unit 1804 is executed.

When the transition-end-state determining unit 1802 determines coincidence, the initial determining unit 1804 tentatively determines the transition-end state resulting from state transition at an element-under-test in the simulation, to be subject to recording to the database 420. Specifically, for example, the state Sk at the time when the transition-end-state determining unit 1802 determines coincidence, is tentatively determined to be a record subject.

The recording-related determining unit 1805 determines whether the state tentatively determined, by the initial determining unit 1804, to be a record subject has been recorded. Specifically, the recording-related determining unit 1805, by referencing the database 420, determines whether context information identical to the record subject has been recorded.

If the recording-related determining unit 1805 determines that the record subject has not yet been recorded, the recording unit 1814 records the record subject to the database 420. On the other hand, if the recording-related determining unit 1805 determines that the record subject has been recorded, since the context information is the same and the state name is different, the correcting unit 1806 corrects the FSM model 100.

The correcting unit 1806, if the recording-related determining unit 1805 determines that the record subject has been recorded, corrects the transition-start state from which transition occurs to the record subject, to the transition-start state from which transition occurs to the transition-end state that has been recorded and coincides with the record subject; and corrects the transition-end state to which the record subject transitions, to the transition-end state to which the recorded transition-end state transitions.

Specifically, for example, for the example depicted in FIG. 14, the state S9 is a record subject and the state S8 is the recorded state coinciding with the state S9. In this case, the transition-end state of the state S4, which is the transition-start state from which transition occurs to the state S9, is set as the state S8 (i.e., the transition-end state of the transition h is changed to the state S8 and the transition is regarded as transition p.

Similarly, among the transition-end states to which transition occurs from the state S9, the state 11 is a transition-end state from the state S8. That is, since the transition i from the state S9 coincides with the transition e from the state S8, the transition i is deleted. Further, the transition-start state of the transition j that transitions to the state S12 is changed from the state S9 to the state S8 and the transition j is regarded as transition q. The correcting unit 1806 executes correction processing each time a correction instruction is received from the recording-related determining unit 1805.

The corrected-FSM output unit 1807 outputs the corrected FSM 1400. Specifically, for example, if all simulations for the test scenarios in the reduced test scenario group Ts have been completed, the corrected-FSM output unit 1807 outputs the final corrected FSM 1400. The corrected FSM 1400, specifically, for example, is stored to a storage apparatus, such as the ROM 302, the RAM 303, the magnetic disk 305, and the optical disk 307 depicted in FIG. 3.

Figure 19:
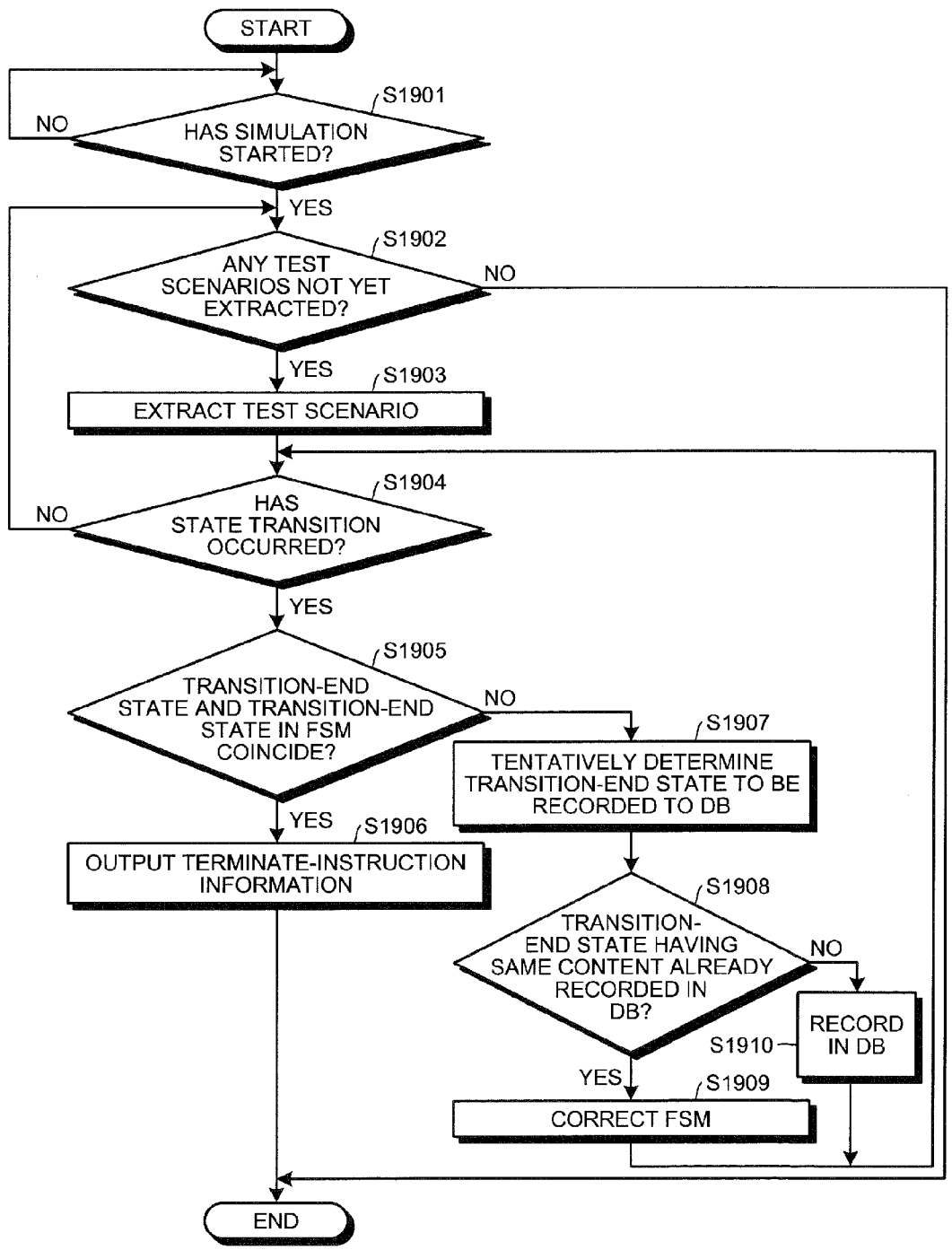
FIG. 19 is a flowchart of an FSM correction processing procedure by the FSM correcting processor.

FIG. 19 is a flowchart of an FSM correction processing procedure by the FSM correcting processor 1502. The FSM correcting processor 1502 waits for simulation to start (step S1901: NO). When simulation starts (step S1901: YES), the FSM correcting processor 1502, via the scenario extracting unit 1801, determines whether there are any test scenarios that have yet to be extracted (step S1902).

If there are test scenarios that have yet to be extracted from the reduced test scenario group Ts (step S1902: YES), the FSM correcting processor 1502 extracts a test scenario (step S1903). Consequently, the extracted test scenario is provided to the simulator 402 and a state transition occurs.

If the occurrence of a state transition induced by the simulator 402 is detected (step S1904: YES), the FSM correcting processor 1502 determines whether the transition-end state resulting from the state transition and the transition-end state in the FSM model 100 coincide (step S1905).

If the transition-end states do not coincide (step S1905: NO), there is discrepancy between the extracted test scenario and the FSM model 100. Hence, the FSM correcting processor 1502, via the determination-result output unit 1803, outputs terminate-instruction information to the simulator 402 (step S1906). Consequently, the simulator 402 terminates the simulation.

At step S1905, if the transition-end states are determined to coincide (step S1905: YES), the FSM correcting processor 1502, via the initial determining unit 1804, tentatively determines the transition-end state resulting from the state transition induced by the simulator 402, to be a record subject to be recorded to the database 420 (step S1907). Subsequently, the FSM correcting processor 1502, via the recording-related determining unit 1805, determines whether a state having the same context information as the tentatively determined record subject is already recorded in the database 420 (step S1908).

If a state is already recorded (step S1908: YES), the FSM correcting processor 1502, via the correcting unit 1806, corrects the FSM model 100 (step S1909) and the flow returns to step S1904. On the other hand, if a state has not been recorded (step S1908: NO), the FSM correcting processor 1502 records the record subject to the database 420 (step S1910), and the flow returns to step S1904.

At step S1904, if no state transition occurs (step S1904: NO), simulation using the extracted test scenario is terminated, and the flow returns to step S1902. At step S1902, the FSM correcting processor 1502 terminates the FSM correction processing, if there are no test scenarios that have yet to be extracted by the scenario extracting unit 1801 (step S1902: NO).

A functional configuration of the recording/restoring processor 1503 will be described with reference to FIG. 18. The recording/restoring processor 1503 includes the classifying unit 1002, the recording unit 1814, the determining unit 1003, and the restoring unit 1005. The classifying unit 1002, the determining unit 1003, and the restoring unit 1005 are identical to that in the first embodiment and description therefor is omitted.

The classifying unit 1002 classifies the type of the element-under-test, during simulation of circuit-under-test, which is simulated by sequentially providing to the circuit-under-test, elements-under-test from a series of elements making up the test-scenario-under-test extracted by the scenario extracting unit 1801. Specifically, for example, test scenarios making up the reduced test scenario group Ts include the test scenario T1 embedded with record-instruction information and the test scenario T2 embedded with restore-instruction information.

The classifying unit 1002 classifies the type of each element-under-test provided to the circuit-under-test from the test-scenario-under-test, to be an element that represents the transition (Sj→Sk), record-instruction information record (Sk), or restore-instruction information restore(Sk).

The recording unit 1814 records the designated transition-end state to the database 420, if the classifying unit 1002 classifies the element-under-test to be record-instruction information. Specifically, for example, if the record-instruction information is "record(Sk)", the state Sk, i.e., the register value that is output from the combinational circuit in the circuit-under-test, is correlated to the identifier of the state Sk and stored to the database 420. In the second embodiment, since recording may be executed by the FSM correcting processor 1502, if the state has been recorded, the recording unit 1814 does not record the state.

Record/restore processing by the recording/restoring processor 1503 will be described. In the first embodiment, FIGS. 12 and 13 were used to describe record/restore processing. Processing in the second embodiment is the same as the record/restore processing procedure depicted in the flowchart (part 1) of FIG. 12 and description therefor is omitted.

Figure 20:
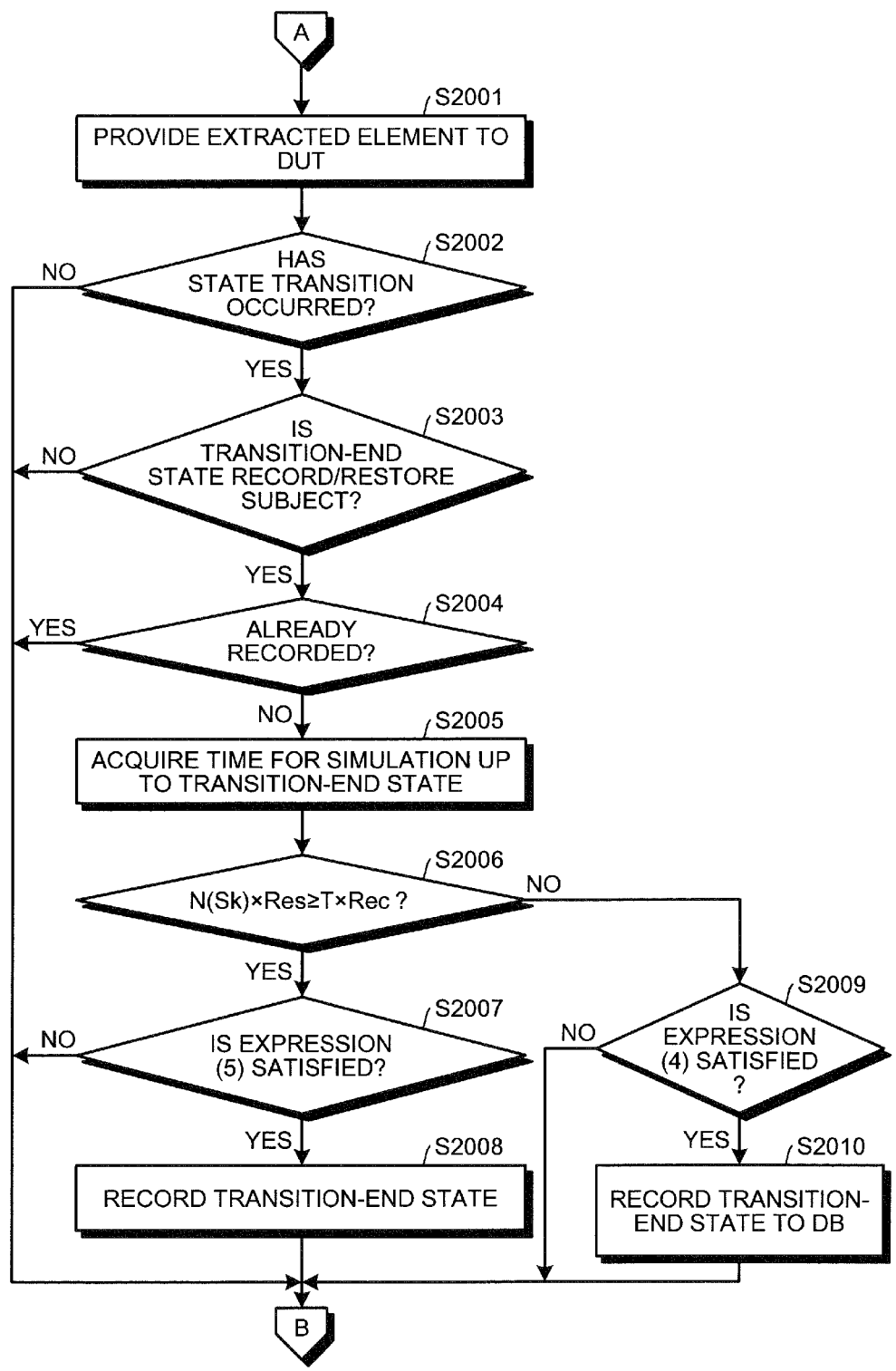
FIG. 20 is a flowchart of a record/restore processing procedure by the recording/restoring processor (part 3).

FIG. 20 is a flowchart of a record/restore processing procedure by the recording/restoring processor 1503 (part 3). The recording/restoring processor 1503 provides the element extracted at step S1206 to the hardware description 430 of the circuit-under-test (step S2001). Consequently, at the simulator 402, simulation of the circuit-under-test is executed and the recording/restoring processor 1503 waits for the occurrence of a state transition (step S2002).

If no state transition occurs (step S2002: NO), the last state has been reached and notification indicating such is received from the simulator 402, in which case the flow returns to step S1205. In this case, even if the flow returns to step S1205, since there are no elements that have not yet been selected, the flow returns to step S1203. State transition from the current state to the next state is regarded as an occurrence of a state transition.

At step S2002, if a state transition has occurred (step S2002: YES), the recording/restoring processor 1503 determines whether the transition-end state Sk resulting from the state transition that has occurred is a record/restore subject (step S2003). Specifically, the recording/restoring processor 1503 determines whether the transition-end state Sk has been designated by the record-instruction information of another test scenario.

If the transition-end state Sk resulting from the state transition that has occurred is not a record/restore subject (step S2003: NO), the flow returns to step S1205. On the other hand, if the transition-end state is a record/restore subject (step S2003: YES), the recording/restoring processor 1503 determines, from the context information, whether the transition-end state Sk has already been recorded to the database 420 (step S2004). Specifically, if there is context information that coincides with the transition-end state Sk, it is determined that the transition-end state Sk has been recorded; if there is no context information that coincides, it is determined that the transition-end state Sk has not been recorded.

If the transition-end state Sk has been recorded (step S2004: YES), the flow returns to step S1205. If the transition-end state Sk has not been recorded (step S2004: NO), the recording/restoring processor 1503 acquires from the simulator 402, the time for simulation from the initial state S0 to the transition-end state Sk (step S2005) and determines whether the transition count difference N(Sk) for the transition-end state Sk multiplied by the restore-time Res is at least equal to a given threshold T multiplied by the record-time Rec (step S2006).

If N(Sk)×Res≥T×Rec is true (step S2006: YES), the recording/restoring processor 1503 determines whether expression (5) is satisfied (step S2007). If expression (5) is not satisfied (step S2007: NO), the flow returns to step S1205. On the other hand, if expression (5) is satisfied (step S2007: YES), the recording/restoring processor 1503 records the transition-end state Sk to the database 420 as context information (step S2008), and the flow returns to step S1205.

At step S2006, if N(Sk)×Res≥T×Rec is not true (step S2006: NO), the recording/restoring processor 1503 determines whether expression (4) is satisfied (step S2009). If expression (4) is not satisfied (step S2009: NO), the flow returns to step S1205. If expression (4) is satisfied (step S2009: YES), the recording/restoring processor 1503 records the transition-end state Sk to the database 420 as context information (step S2010), and the flow returns to step S1205.

By such record/restore processing, even states that are not recorded in the FSM correcting processor 1502, whether the states are to be restored is automatically set and thus, the design engineer need not search for record/restore subjects by trail and error, thereby enabling efficient shortening of the simulation of the circuit-under-test.

As described, according to the present embodiment, through the embedding of record-instruction information into a given test scenario, when simulation is executed, a transition-end state that is a record/restore subject (the value of a register in the circuit-under-test) is recorded to a database. Hence, if simulation using another test scenario is executed and state transition to the record/restore subject occurs, the database is referenced to enable easy restoration.

Further, by embedding into another test scenario, restore-instruction information causing restoration of a record/restore subject stored in the database, when simulation is executed, without executing a redundant scenario included the given test scenario, the record/restore subject can be restored by mere reference to the database. In this manner, since a reduced test scenario group can be automatically generated, the burden of searching for record/restore subjects on the design engineer is reduced, facilitating shortening of the verification period.

Simulation and verification of the FSM model can be executed in parallel, enabling reduction of the verification period. Further, since the FSM model and the reduced test scenario group are created independently, if the FSM model and the FSM verification are executed in parallel, early discovery of inconsistencies becomes possible.

More than simply recording a state to a database, if simulation time is not expected to be shortened, i.e., if the simulation time for a redundant test scenario is less than the processing time for record and for restore, the record/restore subject is not recorded. In this manner, since it can be determined whether time reduction is possible, facilitating efficiency of the simulation.

Although the FSM model and the test scenario group are independently created, automatic generation of the FSM model using the test scenario group enables better assurance of consistency than manual generation, improving verification accuracy.

Further, if the FSM model is automatically generated, since expressions may become redundant, by correcting the FSM model in parallel with simulation, optimization of the FSM model can be facilitated. Correction of the reduced test scenario group by the design engineer using a corrected FSM enables further reduction of the reduced test scenario group by test scenario reduction processing. In this manner, as execution of simulations progresses, test scenarios are shortened, whereby simulation times are reduced more efficiently.

The verification support method described in the present embodiment may be implemented by an execution of a program that is prepared in advance and executed by a computer, such as a personal computer and a workstation. The program is recorded on a non-transitory computer-readable recording medium such as a hard disk, a flexible disk, a CD-ROM, an MO, and a DVD, and is executed by being read out from the recording medium by a computer.

The present embodiments effect efficient reductions in simulation time.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory, computer-readable recording medium storing therein a verification support program causing a computer to execute:
   identifying from a finite state machine model related to a circuit-under-test, an input transition count of transitions to a transition-end state and an output transition count of transition from the transition-end state;
   determining the transition-end state to be a subject, when the identified output transition count is greater than the identified input transition count;
   embedding record-instruction information causing the subject determined at the determining to be recorded to a database, when a first element causing transition to the subject is included in a series of elements making up a first test scenario that is in a test scenario group related to the circuit-under-test, the record-instruction information being embedded as a subsequent element of the first element in the first test scenario; and
   embedding restore-instruction information causing the subject to be restored from the database, when a second element causing transition to the subject is included in a series of elements making up a second test scenario that is in the test scenario group, the restore-instruction information being embedded in the second test scenario and replacing a head element to the second element of the series of elements making up the second test scenario.

2. The non-transitory, computer-readable recording medium according to claim 1, wherein
   the embedding of the restore-instruction information includes embedding the restore-instruction information in the second test scenario, when the second element causing transition to the subject designated by the embedded record-instruction information is included in the series of elements making up the second test scenario.

3. A verification support apparatus comprising:
   a transition count identifying unit configured to identify from a finite state-machine model related to a circuit-under-test, an input transition count of transitions to a transition-end state and an output transition count of transition from the transition-end state;
   a determining unit configured to determine the transition-end state to be a subject, when the identified output transition count is greater than the identified input transition count;
   a first embedding unit configured to embed record-instruction information causing the subject determined by the determining unit to be recorded to a database, when a first element causing transition to the subject is included in a series of elements making up a first test scenario that is in a test scenario group related to the circuit-under-test, the record-instruction information being embedded as a subsequent element of the first element in the first test scenario; and
   a second embedding unit configured to embed restore-instruction information causing the subject to be restored from the database, when a second element causing transition to the subject is included in a series of elements making up a second test scenario that is in the test scenario group, the restore-instruction information being embedded in the second test scenario and replacing a head element to the second element of the series of elements making up the second test scenario.

* * * * *